United States Patent [19]

Ookubo et al.

[11] Patent Number: 4,755,749
[45] Date of Patent: Jul. 5, 1988

[54] STROBO ELECTRON BEAM APPARATUS

[75] Inventors: Kazuo Ookubo, Atsugi; Akio Ito; Yoshiro Goto, both of Yokohama; Toshihiro Ishizuka, Inagi; Kazuyuki Ozaki, Kawasaki, all of Japan

[73] Assignee: Fujitsu Limited, Kawasaki, Japan

[21] Appl. No.: 897,857

[22] Filed: Aug. 19, 1986

[30] Foreign Application Priority Data

Aug. 20, 1985 [JP] Japan .................. 60-182308

[51] Int. Cl.$^4$ ........................ G01N 23/00
[52] U.S. Cl. .................... 324/158 R; 324/158 D; 324/73 R; 250/310; 250/311
[58] Field of Search .......... 324/158 R, 158 D, 73 R; 250/310, 311, 492.1, 492.2

[56] References Cited

U.S. PATENT DOCUMENTS

| | | | |
|---|---|---|---|
| 4,139,774 | 2/1979 | Katagiri | 250/492.2 X |
| 4,220,854 | 9/1980 | Feuerbaum | 324/158 D X |
| 4,277,679 | 7/1981 | Feuerbaum | 324/158 D X |
| 4,486,660 | 12/1984 | Feuerbaum | 324/158 R X |
| 4,539,477 | 9/1985 | Feuerbaum et al. | 324/158 R X |

OTHER PUBLICATIONS

European Search Report, The Hague, 11/10/86, Examiner: Treleven.
Patent Abstracts of Japan, vol. 7, No. 238, Oct. 1983.
Patent Abstracts of Japan, vol. 8, No. 63, Mar. 1984.
Patent Abstracts of Japan, vol. 9, No. 123, May 1985.
Journal of The Electrochemical Society, vol. 115, No. 3, Mar. 1968, p. 77C, Boston Program, "Dynamic Voltage Contrast Display Using the Stroboscopic Scanning Electron Microscope".
Review of Scientific Instruments, vol. 48, No. 3, Mar. 1977, pp. 350-355, W. J. Tee et al., "Improved Voltage Measurement System Using The Scanning Electron Microscope".
IEEE Journal of Solid-State Circuits, vol. SC-13, No. 3, Jun. 1978, pp. 319-325, "Quantitiative Measurement with High Time Resolution of Internal Waveforms on MOS RAM's Using A Modified Scanning Electron Microscope".

Primary Examiner—Reinhard J. Eisenzopf
Assistant Examiner—Vinh P. Nguyen
Attorney, Agent, or Firm—Staas & Halsey

[57] ABSTRACT

A strobo electron beam apparatus is provided having an energy analyzer, which: measures the voltage in the integrated circuit; samples a secondary electron signal by setting and connecting a retarding voltage of the energy analyzer to the measured phase; obtains the waveform of the secondary electron signal by a one time or several times phase scanning; and adds the product of a suitable coefficient and a difference between the secondary electron signal waveform, and a slice level to the retarding voltage and corrects the same. Multiple units are provided for: judging the conversion of the retarding voltage, from the value of the dispersion for the slice level of the secondary electron signal waveform; for adding and giving a mean of the retarding voltage, for obtaining a measured value of retarding voltage having a desired S/N ratio; and for random phase scanning so that the measured value having a desired S/N ratio can be easily obtained.

7 Claims, 32 Drawing Sheets

Fig. 4
CLOCK···159
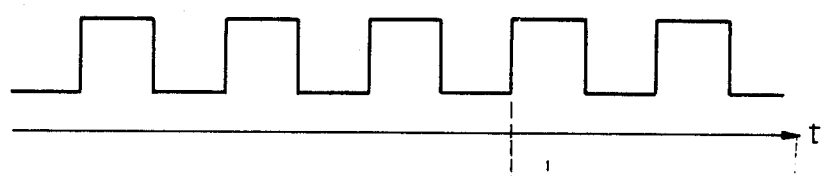
BLANKING PULSE···160
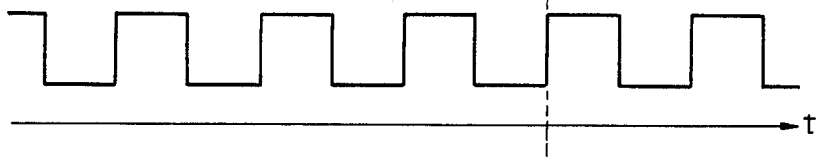
SAMPLING STROBE···162
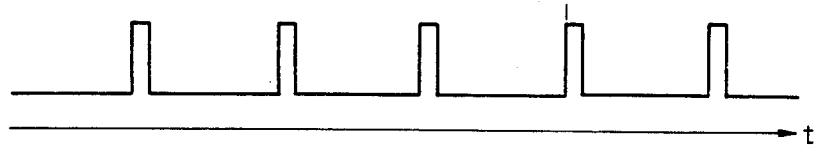

Fig. 5A

| Fig.5 |
|---|
| Fig.5A |
| Fig.5B |
| Fig.5C |
| Fig.5D |

( START )

1) SET REG 5 RETARDING VOLTAGE DATA TO 0V
   $V_R(I) = 0V, I=0, \cdots, 255$

2) SET REG 8 PHASE DATA
   $\phi(I) = \phi_{ini} + I \cdot \phi_{S+P}, I=0, \cdots, 255$ 3) CLEAR REG 13 RETARDING VOLTAGE ADDING VALUE AREA
   $V_R sum(I) = 0, I=0, \cdots, 255$

4) RESET REG 23 CONVERSION FLAG

5) SET RANDOM NUMBER IN 0~255 TO ADDRESS PORTION OF 0~255 OF REG 9 ADDRESS DATA, THE VALUE OF REG 10 BASE ADDRESS POINTER TO $P_1 = 0$, THE VALUE OF REG 11 ADDRESS POINTER TO $P_2 = 256$, THE VALUE OF REG 12 ADDRESS POINTER TO $P_3 = 511$, SHOW THE CONTENT OF ADDRESS I OF REG 9 BY adr(I), $I=0, \cdots, 511$

6) SET SLICE LEVEL SL TO REG 6, REG 17

7) SET CONVERSION COEFFICIENT α TO REG 7, REG 16

8) SET FIRST CONVERSION JUDGEMENT VALUE Verr 1 TO REG 15

9) SET VOLTAGE MEASUREMENT ACCURACY Verr 2 TO REG 18

10) SET SECONDARY ELECTRON SIGNAL ADDING TIMES L TO REG 1, ALL SECONDARY ELECTRON SIGNAL ADDING TIMES M TO REG 2, PHASE SCANNING TIMES J TO REG 21

Fig. 10
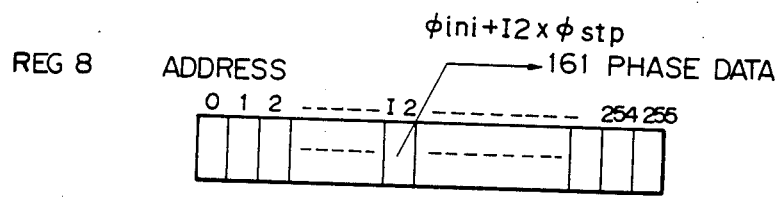
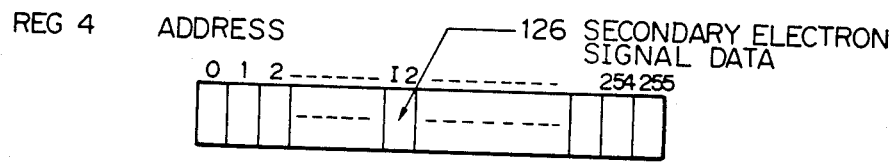
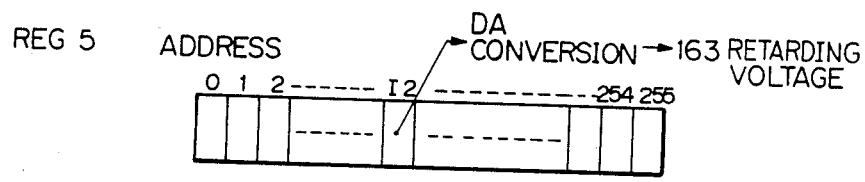
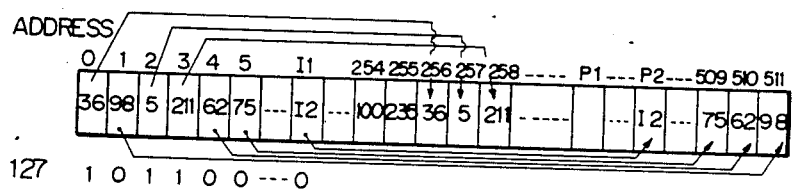
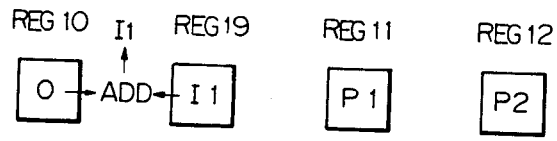

Fig. 13

| REGISTER | REGION | DATA TYPE | CONTENT OF REGISTER |
|---|---|---|---|
| REG 1 | 16 Bit | UNSIGNED INTEGER | ADDING TIMES OF SECONDARY ELECTRON SIGNAL L |
| REG 2 | 16 Bit | " | ADDING TIMES OF ALL SECONDARY ELECTRON SIGNALS M |
| REG 3 | 32 Bit | FLOAT | SECONDARY ELECTRON SIGNAL DATA |

Fig. 14

| REGISTER | REGION | DATA TYPE | CONTENT OF REGISTER |
|---|---|---|---|
| REG 4 | 256 x 32 Bit | FLOAT | SECONDARY ELECTRON SIGNAL DATA |

Fig. 15

| REGISTER | REGION | DATA TYPE | CONTENT OF REGISTER |
|---|---|---|---|
| REG 5 | 256 x 32 Bit | FLOAT | RETARDING VOLTAGE DATA |
| REG 6 | 32 Bit | " | SLICE LEVEL SL |
| REG 7 | 32 Bit | " | CONVERSION COEFFICIENT $\alpha$ |

Fig. 16

| REGISTER | REGION | DATA TYPE | CONTENT OF REGISTER |
|---|---|---|---|
| REG 8 | 256 x 16 Bit | UNSIGNED INTEGER | PHASE DATA |

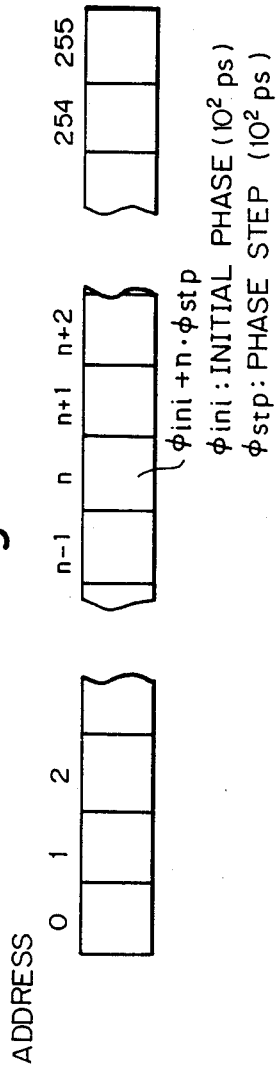

Fig. 19

| REGISTER | REGION | DATA TYPE | CONTENT OF REGISTER |
|---|---|---|---|
| REG 13 | 256 x 32 Bit | FLOAT | ADDED VALUE OF RETARDING VOLTAGE DATA |
| REG 14 | 8 Bit | UNSIGNED INTEGER | ADDING TIME COUNTER |

Fig. 20

| REGISTER | REGION | DATA TYPE | CONTENT OF REGISTER |
|---|---|---|---|
| REG 15 | 32 Bit | FLOAT | VALUE OF FIRST CONVERSION JUDGEMENT $V_{conv}$ |
| REG 16 | 32 Bit | FLOAT | CONVERSION COEFFICIENT $\alpha$ |
| REG 17 | 32 Bit | FLOAT | SLICE LEVEL SL |

Fig. 21

| REGISTER | REGION | DATA TYPE | CONTENT OF REGISTER |
|---|---|---|---|
| REG 18 | 32 Bit | FLOAT | SECONDARY CONVERSION ERROR  Verr 2 |

Fig. 22

| REGISTER | REGION | DATA TYPE | CONTENT OF REGISTER |
|---|---|---|---|
| REG 19 | 8 Bit | UNSIGNED INTEGER | PHASE FEEDING COUNTER |
| REG 20 | 1 Bit | FLAG | OVER FLOW FLAG |

Fig. 23

| REGISTER | REGION | DATA TYPE | CONTENT OF REGISTER |
|---|---|---|---|
| REG 21 | 16 Bit | UNSIGNED INTEGER | TIMES OF PHASE SCANNING J |
| REG 22 | 16 Bit | UNSIGNED INTEGER | PHASE SCANNING COUNTER |

Fig. 24

| REGISTER | REGION | DATA TYPE | CONTENT OF REGISTER |
|---|---|---|---|
| REG 23 | 1 Bit | FLAG | CONVERSION FLAG |

Fig. 25

| REGISTER | REGION | DATA TYPE | CONTENT OF REGISTER |
|---|---|---|---|
| REG 24 | 10 Bit | UNSIGNED INTEGER | ADDING TIMES OF RETARDING VOLTAGE |

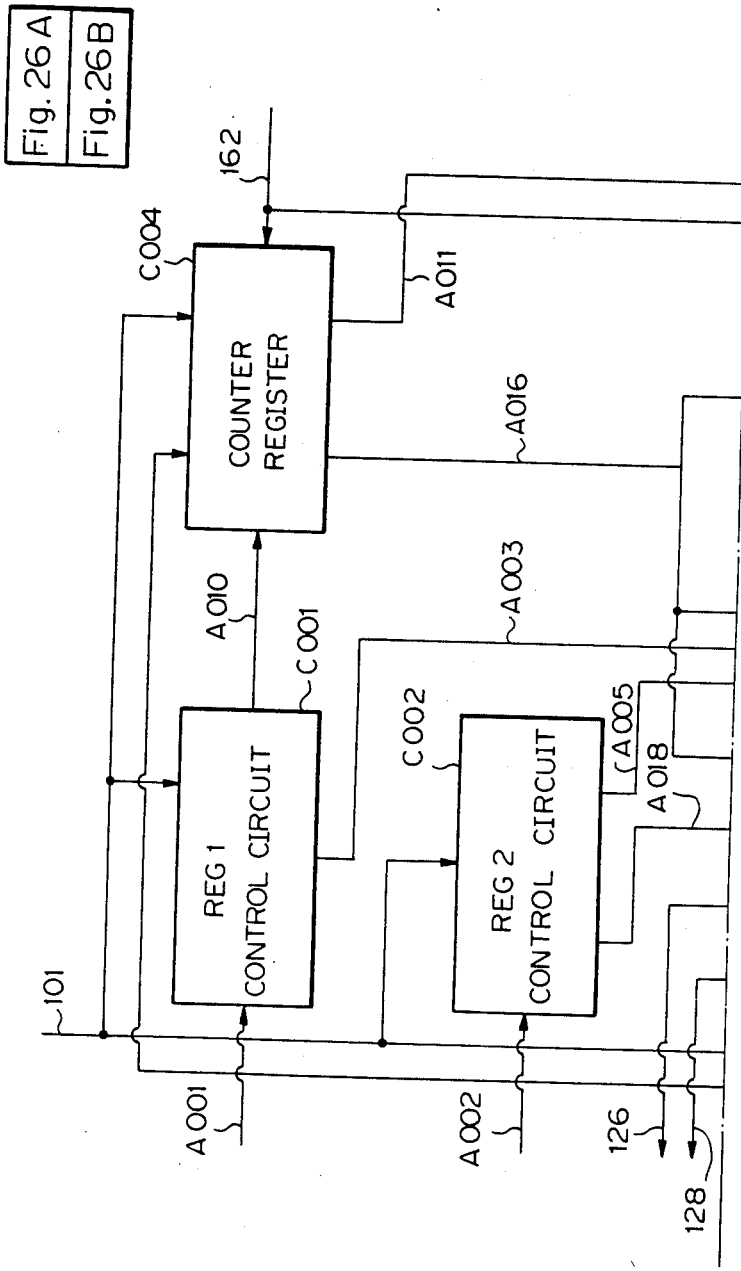

STROBO ELECTRON BEAM APPARATUS

BACKGROUND OF THE INVENTION

The present invention relates to a strobo electron beam apparatus which provides a retarding field type energy analyzer for measuring a voltage and which quantitively observes the waveform of the voltage in the examined integrated circuit operated rapidly, and especially to the strobo electron beam apparatus which quantitizes the voltage waveform by controlling the retarding voltage supplied to the energy analyzer connected to a phase scanning operation.

As the method for quantitizing the voltage waveform in the integrated circuit by using strobo beams, the method for obtaining the voltage waveform with a one phase scanning operation (one time phase scanning method) is known. (Unexamined Japanese patent publication (Kokai) No. 59-225539 and No. 60-10739).

As the method for measuring the voltage waveform in the integrated circuit via an insulation film, a plurality of times phase scanning method and a precharge (erase) method using a serial scanning are known. (Unexamined Japanese patent publication (Kokai) No. 117640)

However, in the one time phase scanning method, a large amount of EB radiation is carried out at a same time and at one phase point, and accordingly, the voltage waveform measurement via the insulation film is difficult because of the charge up phenomena of the insulation film. Further, in the one time phase scanning method, if the metal wiring portion is directly probed, contamination is increased and thus the base line is displaced. Accordingly, a stable measurement of the voltage waveform is difficult when the base line sampling is not carried out.

The precharge method (Unexamined Japanese patent publication (Kokai) No. 60-117640) can quantitize the voltage waveform by cooperating with the one time phase scanning method, but an erase operation is required and thus the measuring time is increased.

Further, in the usual serial plurality of time phase scanning method (Todokoro, Fukuhara, Japanese Society for Promotion of Science, Committee 132, (Electron and Ion Beam Science and Technology) 82, Research Document p 20 (1982), unless the radiated amount of EB per one phase scanning is decreased, the voltage waveform of the wiring under the insulation film cannot be obtained without the charge up phenomena occurring. If, in the usual plurality of times phase scanning method, the phase scanning is carried out at a high speed, to remove the effect of the charge up, the frequency response of the energy analyzer must be more than 10 MHz, and therefore the quantitization of the voltage waveform is difficult to realize.

SUMMARY OF THE INVENTION

Accordingly, an object of the present invention is to provide a strobo electron beam apparatus which provides means of correcting the retarding voltage in the energy analyzer and means for randomly changing the phase scanning, so that the measuring time can be shortened and the voltage measurement accuracy can be improved.

To achieve the above-mentioned, the present invention provides a strobo electron beam apparatus including: strobo electron beam means for detecting voltage in an examined integrated circuit having a high speed operation; a phase scanning means for scanning the phase of a strobo electron beam; energy analyzing means for analyzing a secondary electron energy obtained at each phase scanning from the examined integrated circuit; secondary electron detecting means for detecting the secondary electron energy analyzed at each phase scanning; retarding voltage control means for correcting the retarding voltage supplied to the energy analyzing means at each phase scanning from the secondary electron signal obtained from the secondary electron detecting means; conversion judgment means for calculating an error of the corrected analyzed voltage to judge the conversion thereof; repeating means for repeating the operations of the phase scanning, secondary electron energy detection, retarding voltage correction, and conversion judgment when the error is judged to be beyond predetermined value; and a retarding voltage adding means which, when the error is judged to be below a predetermined value by the conversion judging means, repeats the operations of the phase scanning, the secondary electron signal detection, and the retarding voltage correction by a number of times determined by the error and a desired voltage measurement accuracy, and which calculates and outputs the added means of each corrected retarding voltage obtained therefrom at each phase scanning, and further the strobo electron beam apparatus has random phase scanning commanding means for commanding a random phase scanning to the phase scanning means and commanding order changing means for changing the order of a phase scanning command in said commanding means at every one set of phase scanning commands.

According to the above-mentioned means, the retarding voltage can be connected and converged in a short time based on a predetermined relative relationship, the measured retarding voltage having a desired signal to noise S/N ratio can be obtained from the relationships between the dispersion value of the converged value and the voltage measurement accuracy.

On the other hand, by carrying out the random phase scanning, the wiring operated under a low repetition frequency can be measured in the same way as the wiring operated under a high frequency. Accordingly, the voltage waveform of the wiring under the insulation film can be sampled without the attenuation caused by the charge up phenomena.

Further, by changing the combination of the order of the phase scanning, the state of the charges on the surface of the insulation layer becomes statistically constant, regardless of the measuring phase. In the conventional precharge method, a preradiation of the beam is effected to obtain such a state, but, according to the present invention, a similar condition can be obtained without the preradiation.

Further features and advantages of the present invention will be apparent from the ensuing description with reference to the accompanying drawings to which, however, the scope of the invention is in no way limited.

BRIEF DESCRIPTION OF THE DRAWINGS

FIG. 4 is a timing chart for explaining the operation of the strobo delay circuit;

FIGS. 5 and 5A-5D are diagrams showing a sequence of the operation of the present invention;

FIG. 10 is a diagram explaining a random phase scanning system;

FIG. 13 is a diagram showing a construction of registers of a secondary electron signal adding circuit;

FIG. 14 is a diagram showing a construction of registers of a secondary electron signal processing circuit;

FIG. 15 is a diagram showing a construction of registers of an retarding voltage control circuit;

FIG. 16 is a diagram showing a construction of registers of a phase control circuit;

FIG. 17 is a diagram showing an initialization of Reg. 8;

FIG. 18 is a diagram showing a construction of registers of a random address generator circuit;

FIG. 19 is a diagram showing a construction of registers of a retarding voltage data processing circuit;

FIG. 20 is a diagram showing a construction of registers of a conversion judging circuit;

FIG. 21 is a diagram showing a construction of registers of a repeating time setting circuit;

FIG. 22 is a diagram showing a construction of registers of a phase feeding counter circuit;

FIG. 23 is a diagram showing a construction of registers of a phase scanning counter circuit;

FIG. 24 is a diagram showing a construction of registers of a conversion flag setting circuit;

FIG. 25 is a diagram showing a construction of registers of a retarding voltage adding counter circuit.

FIGS. 26 and 26A-26B are block diagram of an internal construction of the secondary electron signal adding circuit 11 shown in FIG. 1;

DESCRIPTION OF THE PREFERRED EMBODIMENTS

Hereinafter, the embodiments of the present invention will be explained in detail.

{Construction of a strobo electron beam apparatus (FIG. 1 and FIG. 2)}

Figure 2:
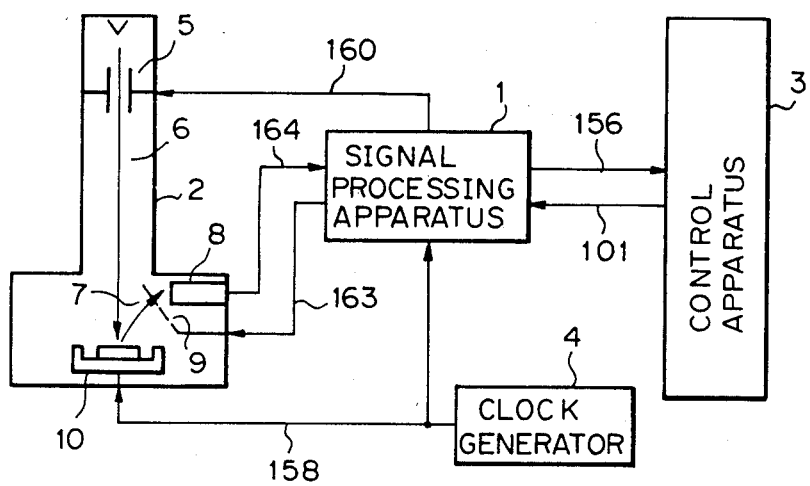
FIG. 2 is a diagram showing a construction of a strobo electron beams apparatus according to the present invention.

A block diagram of the strobo electron beam apparatus as one embodiment of the present invention is shown in FIG. 2. The present invention provides a signal processing apparatus 1, a strobo scanning electron microscope (SEM) apparatus 2 having a retarding field type energy analyzer 9, a control apparatus 3, and a clock signal generator 4. Further, the SEM apparatus 2 is formed by a blanker 5, which converts a primary electron beam into a pulse form, and an energy analyzer 9, which analyzes an energy of secondary electrons 7 radiated from an examined IC 10 by a strobo electron beam 6, and a secondary electron signal detector 8 which detects a secondary electron signal and converts it to an electric signal.

101 is a start signal of the signal processing apparatus, 156 is an end signal of the signal processing apparatus, 158 is a clock signal, 160 is a blanking pulse, 163 is a retarding voltage, and 164 is a secondary electron signal.

Figure 1:
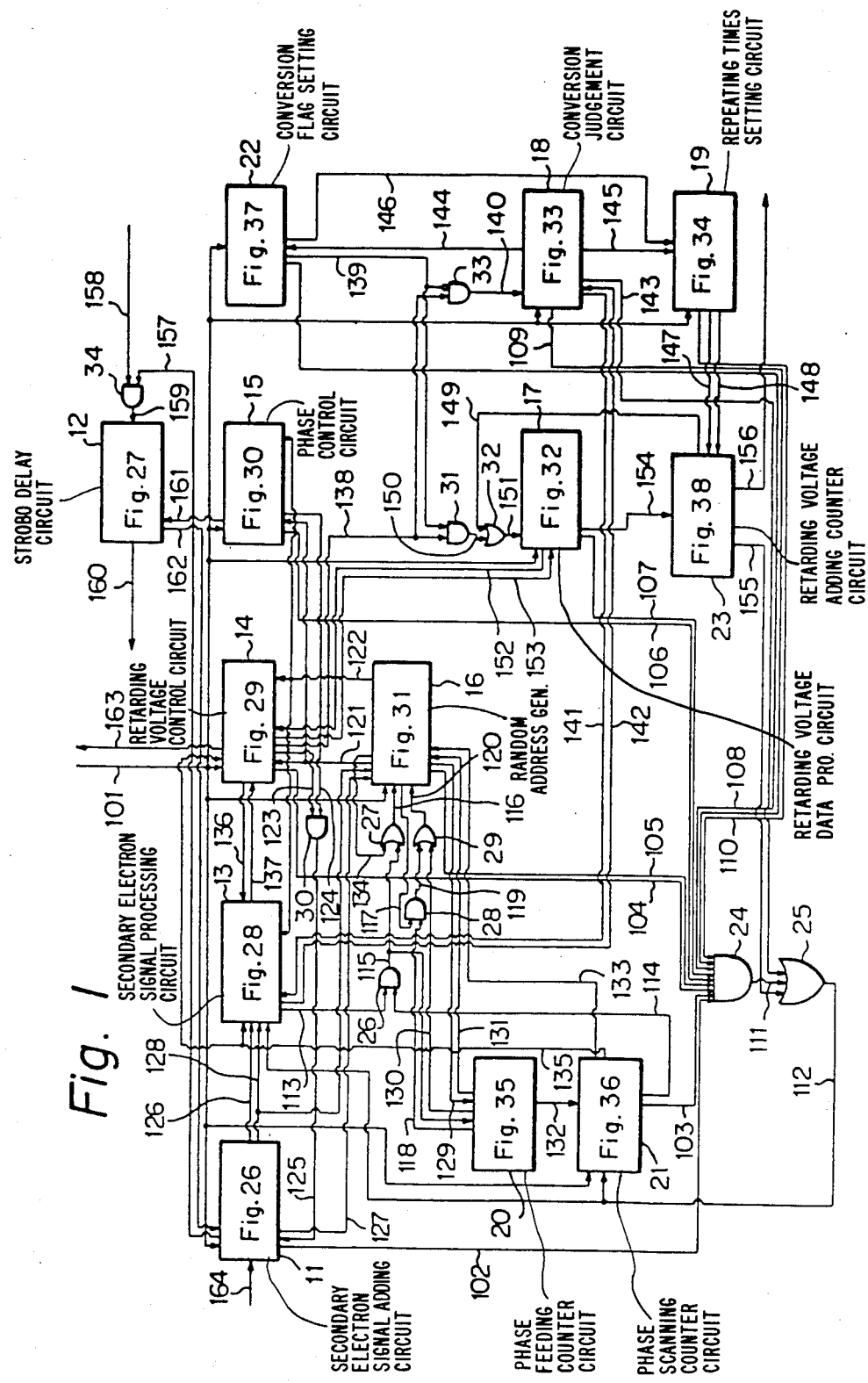
FIG. 1 is a diagram showing a construction of a signal processing apparatus according to the present invention.

The signal processing apparatus 1 is shown in FIG. 1. The signal processing apparatus is formed by a secondary electron signal adding circuit 11, a strobo delay circuit 12, a secondary electron signal processing circuit 13, a retarding voltage control circuit 14, a phase control circuit 15, a random address generator 16, a retarding voltage data processing circuit 17, a conversion judgement circuit 18, a repeating times setting circuit 19, a phase feeding counter circuit 20, a phase scanning counter circuit 21, a conversion flag setting circuit 22, a retarding voltage adding counter circuit 23, and AND and OR circuits 24~34.

{Explanation of an operation of the strobe electron beam apparatus (FIG. 1)}

Referring to the operation of the strobe electron beam apparatus constructed above, first, the summary thereof will be given.

[Operation 1]

At the time that the random address generator 16 generates N points of random address information in order, N counts for reading the random information at that time are generated by a phase feeding counter circuit 20. Then, corresponding phase data is generated by the phase control circuit 15 at every address, and the electron beam 6 corresponding to each phase is irradiated via the strobo delay circuit 12 and the blanker 5 (FIG. 2) to the examined IC 10.

Simultaneously, the retarding voltages corresponding to each phase above are read from a register in the retarding voltage control circuit 14, and are applied to the energy analyzer 9 (FIG. 2). At this time, the address pointer for registers equals each address mentioned above generated in the random address generator 16.

Next, in each phase mentioned above, the secondary electron signal 164 is detected L times in the secondary electron signal detector 8 (FIG. 2) and is added L times and is averaged by the secondary electron signal adding circuit 11. Then the result of the averaging in each phase is added in to a register of the secondary electron signal processing circuit 13. At this time, the addresses in each register have the value of each address generated in the random address generator 16.

By the above-mentioned operation, an added mean value of the detected secondary electron signals of L samples is obtained at every N phase points generated randomly.

[Operation 2]

The operation 1 is repeated J times. The repeat of J times is controlled by the phase scanning counter circuit 21. As a result, at each of the phase points generated at random, the added results of detected secondary electron signals of $M = L \times J$ sample are obtained in N registers in the secondary electron signal processing circuit 13.

[Operation 3]

After the operation 2 is ended, from the result of the added means of the secondary election signals at N phase points, a retarding voltage corresponding to the next N phase points is determined and this retarding voltage value is set in each register in the retarding voltage control circuit 14. At this time, the prior each retarding voltage value and a predetermined conversion coefficient $\alpha$ are used.

[Operation 4]

After the operation 3 is ended, the conversion judging circuit 18 calculates a voltage measurement error $V_{err1}$ at each of the N phase points above for a predetermined slice level. At this time, the conversion coefficient $\alpha$ is used. If $V_{err1}$ is not lower than a predetermined value of first conversion judgement $V_{conv}$, the above-mentioned operations 1~3 are repeated by correcting the retarding voltage.

When $V_{err1}$ becomes lower than $V_{conv}$, the above-mentioned operations 1~3 are repeated only a predetermined number of times K, and the added mean value of K times the retarding voltage values are calculated at each of the N phase points. At this time, the value of K is determined from the ratio between $V_{err1}$ and a predetermined secondary conversion error $V_{err2}$. Further, above addition is carried out by the retarding voltage data processing circuit 17, and the setting and the control of the number of repeating times K are carried out by the repeating times setting circuit 19 and the conversion flag setting circuit 22.

[Operation 5]

The result of the K times addition of the retarding voltage at every phase point obtained by the operation 4 is output to the control apparatus 3 as a final output.

As mentioned above, by the operations 1~5, the result of a measured voltage for N phase points can be obtained with a good accuracy within a predetermined accuracy $V_{err2}$. Hereinafter, the operations of each circuit will be explained in detail.

{Explanation of the operation of the secondary electron signal adding circuit 11 (FIG. 1 and FIG. 13)}

The following is an explanation of the operation of the secondary electron signal adding circuit 11. In the secondary electron signal adding circuit 11, there is a Reg 1 and Reg 2 each having a 16 Bit depth, and a Reg 3 having a 32 Bit depth. Upon receipt of a strobe from the starting signal 101, the secondary electron signal adding circuit 11 reads the adding times of secondary electron signal L from the control apparatus 3 to Reg 1, and when all secondary electron signal adding times M are read in Reg 2, a signal line 102 is made to a high potential and a mask 157 is made to a low potential. When a signal line 111 is made to a high potential, the signal line 102 is reset. Data setting means for Reg 1, Reg 2 and a reset means for the signal line 102 are omitted. When the secondary electron signal adding circuit 11 receives the strobe from the signal line 125, it clears Reg 3, and thereafter, makes the mask 157 to a high potential. Then the sampling strobe 162 synchronized with the blanking pulse 160 is output from the strobo delay circuit 12. The sampling strobe 162 becomes a trigger for AD conversion of the secondary electron signal 164, and the AD converted data is converted to a floating point representation and is added to Reg 3. When the secondary electron signal adding circuit 11 receives the sampling strobe 162 L times, it makes the mask 157 to a low potential, and multiplies the content of the Reg 3 by 1/M to make the secondary electron signal data 126. After a least significant bit of a final AD converted value is made the LSB data 127, the strobe is generated in the signal line 128. The LSB data 127 is a natural random number having a value of 0 or 1, and is used for randomly combining the order of a phase scanning mentioned hereafter.

Figure 26B:
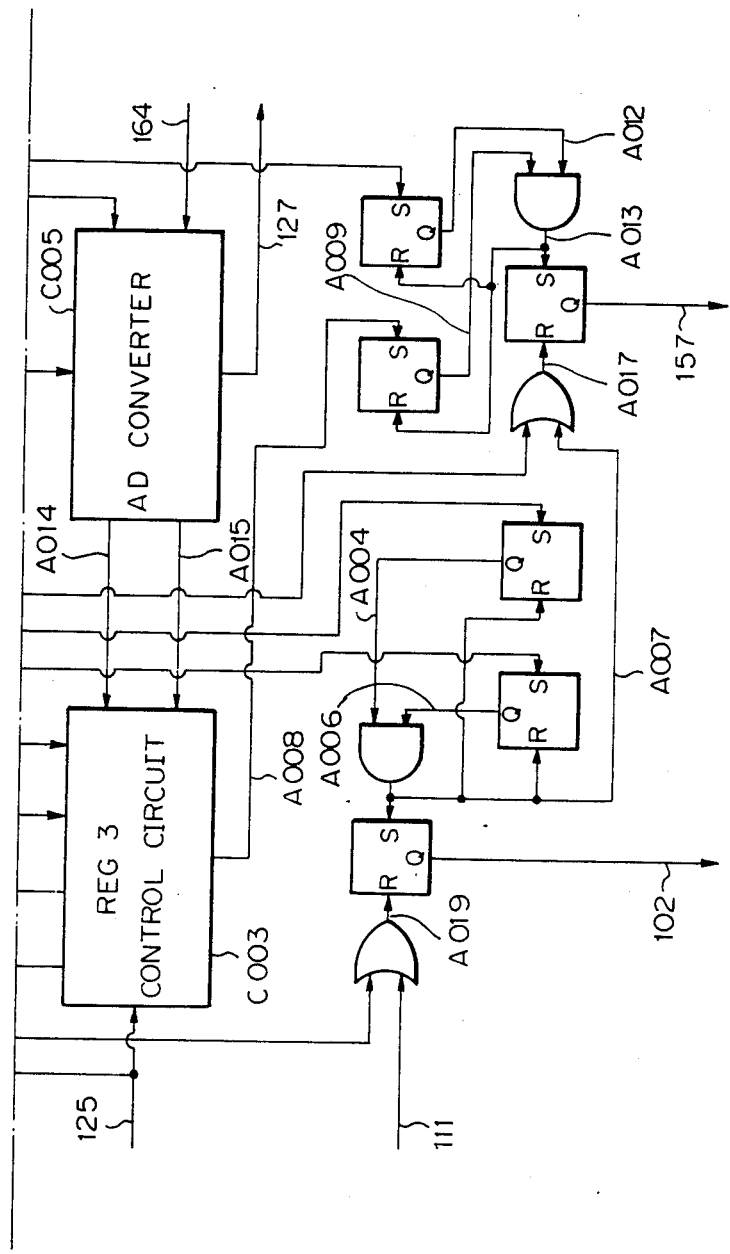

{Explanation of an internal constrūction of the secondary electron signal adding circuit 11 (FIG. 26)}

The following is the explanation of the internal construction of the secondary electron signal adding circuit 11.

The secondary electron signal adding circuit 11 is formed by a Reg 1 control circuit C001 formed by Reg 1 and a peripheral circuit, a Reg 2 control circuit C002 formed by Reg 2 and a peripheral circuit, a Reg 3 control circuit C003 formed by Reg 3 and a peripheral circuit, a counter register circuit C004 formed by a temporary counter register having a 16 Bit depth, an AD converter C005, and AND gates, an OR gate and RS flip-flop circuits.

When the Reg 1 control circuit C001 receives a strobe from a start signal 101, it reads a number of times L of adding the secondary electron signals from a control apparatus 3 via a signal line A001 to Reg 1, and thereafter, generates a strobe to a signal line A003. The content of Reg 1 appears in the signal line A010. In FIG. 1, the signal line A010 is omitted.

When the Reg 2 control circuit C002 receives a strobe from a start signal 101, it reads a number of times M of adding all secondary electron signals from a control apparatus 3 via a signal line A002 to Reg 2, and thereafter, generates a strobe to a signal line A005. The content of Reg 2 appears in the signal line A018. In FIG. 1, the signal line A002 is omitted.

A signal line 102 detects the rising in the signal line A003, and when the rising is detected in the signal line A005, it is made to a high electric potential. The signal line 102 is made to a low electric potential when it detects a rising in the start signal 101 or the signal line 111. In FIG. 1, the signal line 111 is omitted.

When the Reg 3 control circuit C003 receives a strobe from the signal line 125, it clears Reg 3, and thereafter, generates a strobe to a signal line A008.

When the circuit C003 receives an AD conversion ending strobe from a signal line A014, it floats the AD converted data appearing in the signal line A015, and thereafter, is added to Reg 3.

When the circuit C003 receives a strobe from the signal line A016, the circuit C003 writes the result in which the data stored in Reg 3 is divided by the content M of Reg 2 appearing in the signal line A018 to the secondary electron signal data 126, and generates a strobe to the signal line 128 after the signal line 126 becomes stable.

The counter register circuit C004 is provided therein with a temporary register having a 16 Bit depth, and when the circuit C004 receives a strobe from the signal line 125, circuit C004 transfers the content of Reg 1 appearing in the signal line A010 to the temporary register, and thereafter, generates a strobe to the signal line A011.

When the circuit C004 receives a sampling strobe 162, it decrements the content of the temporary register by 1. At this time, as a result of the decrement, when the content of the temporary register becomes 0, it generates a strobe to the signal line A016 after a suitable waiting time. The waiting time is suitably selected to be somewhat longer than a series of operations so that the circuit C003 writes the result of the AD conversion of the secondary electron signal 164 effected by the AD conversion circuit C005 after the sampling strobe is received.

When the signal line A008 detects a strobe, and the signal line A011 detects a strobe, a mask 157 is made to a high electric potential. When a signal line A007 or a signal line A016 detects a strobe, the mask 157 is made to a low electric potential.

The AD conversion circuit C005 carries out an AD conversion of the secondary electron signal 164 synchronized with the sampling strobe 162. When the AD conversion is ended, the result thereof is set in the signal line A015, and the strobe following is generated to the signal line A014.

When the AD conversion circuit C005 receives a strobe from the signal line A016, it sets the LSB of the final AD converted value to the signal line 127 as LSB data. The setting of the data to the signal line 127 is carried out almost without delay of the strobe to the signal line A016.

{Explanation of the operation of the strobo delay circuit 12 (FIG. 1 and FIG. 4)}

Hereinafter an explanation of the operation of the strobo delay circuit 12 is given. FIG. 4 is a timing chart showing the operation of the strobo delay circuit 12. The strobo delay circuit 12 generates the blanking pulse 160 having a delay of IPH×100 PS to the clock 159. The sampling strobe 162 has a fixed delay of $\tau$ del seconds for the blanking pulse 160. IPH is given by the phase data 161 of an unsigned integer. The phase data 161 is given by 16 Bit data, that is, about 65,000 levels, and accordingly, the delay time of the blanking pulse 160 is about 6.5 $\mu$s max.

Figure 27:
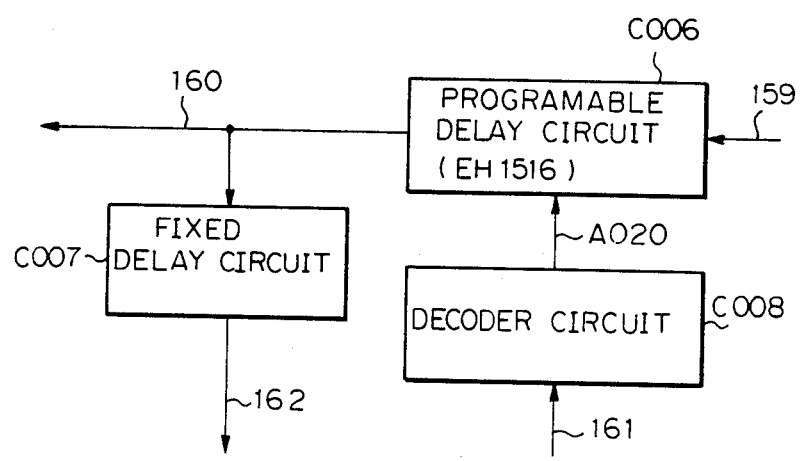
FIG. 27 is a block diagram of an internal construction of the strobo delay circuit 12 shown in FIG. 1.

{Explanation of an internal construction of the strobo delay circuit (FIG. 27)}

The following is the explanation of the internal construction of the strobo delay circuit 12. The strobo delay circuit is formed by a programmable delay circuit C006, a fixed delay circuit C007, and a decoder C008.

As the programmable delay circuit C006, an EH 1516 with a parallel interface manufactured by EH International Inc. is used. The circuit C006 generates a blanking pulse 160 having a delay amount specified by the signal line A020 for the parallel interface for the clock input from the signal line 159.

The fixed delay circuit C007 gives the fixed delay $\tau$ (seconds) for the blanking pulse 160 so as to generate a sampling strobe 162.

The decoder circuit C008 converts the phase data given to the signal line 161 by a 16 Bit unsigned integer in a packed decimal manner so as to correspond to the parallel interface of the EH 1516. The result of the conversion is written in the signal line A020.

{Explanation of the operation of the secondary electron signal processing circuit 13 (FIG. 1 and FIG. 14)}

Hereafter an explanation of the secondary electron signal processing circuit 13 is given. In the secondary electron signal processing circuit 13, as shown in FIG. 14, there is a register group Reg 4 of 256 having a depth of 32 Bits designated by addresses 0~255 for adding the secondary electron signal. The Reg 4 is the register for storing the secondary electron signal data 126 for each phase scanning and the address thereof is supplied by a relative address data 122 from the random address generator 16. When the secondary electron signal processing circuit 13 receives the strobe via the signal line 112 from the OR circuit 25, it is brought to the adding mode, and after clearing Reg 4, it makes the signal line 113 to the AND circuit 26 to a high potential. When the signal line 115 is made to a high potential, it is reset. The reset means for the signal line 113 is omitted.

In above-mentioned adding mode, when the secondary electron signal processing circuit 13 receives a strobe to the signal line 128, the secondary electron signal data 126 is added to each register in Reg 4 specified by the relative address data 122 from the random address generator 16. Further, in the adding mode, the requests 136, 141 for reading the secondary electron signal are masked.

Next, the operation for reading the signal will be explained. When the secondary electron signal processing circuit 13 receives the strobe from the signal line 135 from the phase scanning counter circuit 21, it is made to a signal reading mode. When, signal line 135 indicates a signal reading mode, and the request 136 for reading the secondary electron signal from the retarding voltage control circuit 14 receives the strobe for the first time, the content of the register specified by the address 0 in the Reg 4 appears at the secondary electron signal data 137. Hereinafter, when the strobe is received at the secondary electron signal reading request 136, the data of the register in Reg 4 specified by the address in which a prior address is incremented is sent to the secondary electron signal data 137. The above-mentioned operation is similar to the secondary electron signal reading request 141 between the conversion judging circuit 18 and the secondary electron signal data 142. Further, in the signal reading mode, the signal line 128 is masked.

Figure 28:
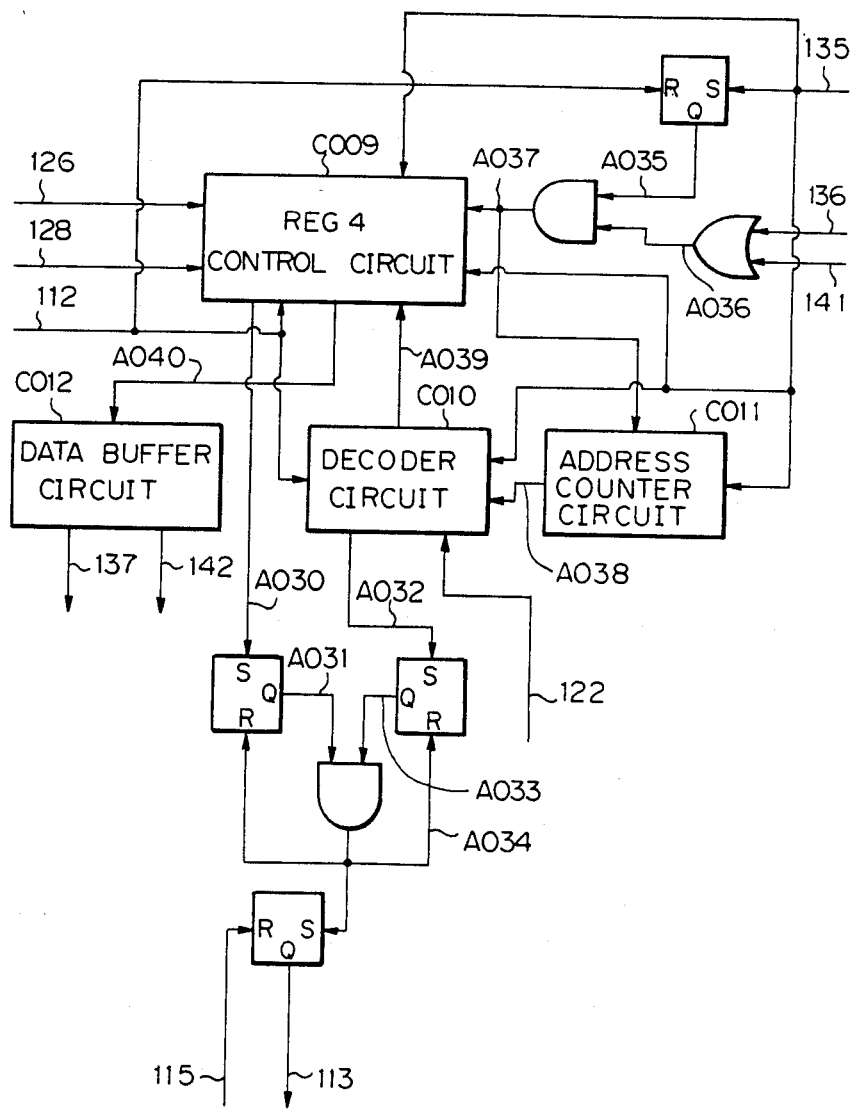
FIG. 28 is a block diagram of an internal construction of the secondary electron signal processing circuit 13 shown in FIG. 1.

{Explanation of an internal construction of the secondary electron signal processing circuit 13 (FIG. 28)}

The following is an explanation of the internal construction of the secondary electron signal processing circuit.

The secondary electron signal processing circuit is formed by a Reg 4 control circuit C009 including Reg 4 and the peripheral circuit thereof, a decoder circuit C010, an address counter C011, a data buffer circuit C012, AND gates, an OR gate, and flip-flop circuits.

When the Reg 4 control circuit C009 receives a strobe from the signal line 112, it is made to the adding mode, and after clearing the Reg, generates a strobe to the signal line A030. In the adding mode, the signal line A035 is made to a low electric potential, and the secondary electron signal read requests 136, 141 are masked.

When the circuit C009, in the adding mode, receives a strobe to the signal line 128, the circuit adds the secondary electron signal data 126 to each register in Reg 4 specified by the address in the signal line A039.

When the circuit C009, receives a strobe from the signal line 135, it is made to a data reading mode. When the strobe is generated to the signal line 135, the RS flip-flop is set and the signal line A035 is made to a high potential. Then, the mask for the secondary electron signal read requests 136, 141 is removed.

When the circuit C009, in the above-mentioned data reading mode, receives a strobe to the signal line A037, it reads the secondary electron signal data stored in each register of the Reg 4 specified by the address of the signal line A039 to the signal line A040.

The decoder circuit C010 converts the address given from the signal line 122 or the signal line A038 to match the circuit C009.

When the circuit C010 receives a strobe from the signal line 112, it is made to an adding mode, and the circuit C010 converts an address data given by the signal line 122 to match the circuit C009, and thereafter, sets the address data to the signal line A039. When the circuit C010 receives a strobe from the signal line 112, it is made to an adding mode, there after it generates a strobe to the signal line A032.

When the decoder circuit C010 receives a strobe to the signal line 135, it is made to a data reading mode and it converts an address data given by the signal line A038 to match the circuit C009, and, thereafter, sets the address data to the signal line A039.

When the address counter C011 receives a strobe to the signal line 135, it clears the address counter having a 9 Bit depth in the circuit C011. The value of the address counter is set to the signal line A038. When the address counter circuit C011 receives a strobe from the signal line A037, it increments the value of the address counter by 1. The timing for incrementing the address counter is immediately after that at which the circuit C009 receives a strobe from the signal line A037 and sets the secondary electron signal data to the signal line A040.

The data buffer circuit C012 distributes the secondary electron signal data appearing in the signal line A040 to the signal line 137 and the signal line 142.

When the signal line 113 receives a strobe to the signal line A030 and the signal line A032, it is made to a high electric potential, and when it receives a strobe to the signal line 115, it is made to a low electric potential. The signal line is not shown in FIG. 1.

{Explanation of the operation of the retarding voltage control circuit 14 (FIG. 1, FIG. 3 and FIG. 15)}

Figure 3:
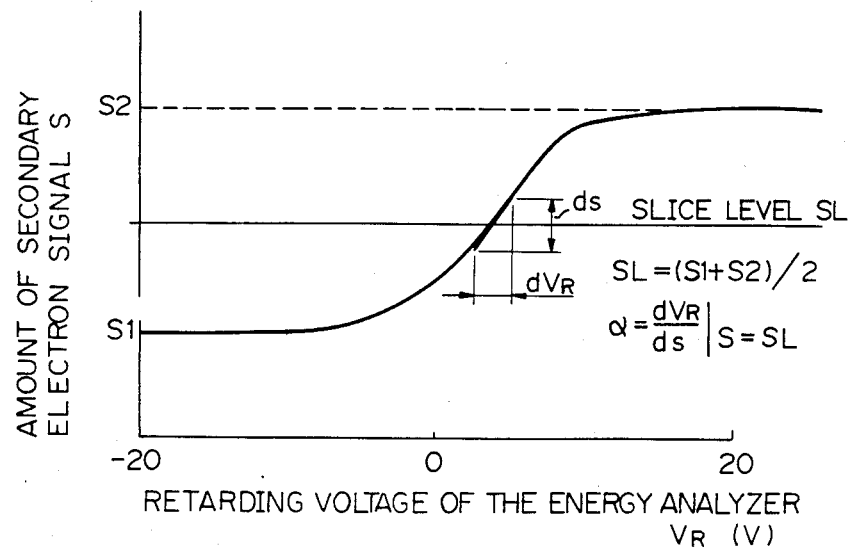
FIG. 3 is a diagram showing relationships between an analyzed curve and a conversion coefficient α.

The following is an explanation of the retarding voltage control circuit 14. In the retarding voltage control circuit 14, as mentioned in FIG. 15, there is a group of registers Reg 5 formed by 256 having a 32 Bit depth by the addresses 0~255 for storing retarding voltage data, a 32 Bit Register Reg. 6 for storing the slice level SL, and a 32 Bit Register Reg. 7 for storing a conversion coefficient $\alpha$. Reg. 5 is a register for storing a next retarding voltage in each phase scanning, and the address is supplied by the relative address data 122 from the random address generator 16. When the retarding voltage control circuit 14 receives a strobe from a starting signal 101, it makes an initial value of 256 retarding voltage data in Reg. 5 to 0, and it sets the slice level SL from the control apparatus 3 to the read Reg. 6 and similarly, the conversion coefficient to the read Reg. 7, and then makes the signal line 104 to the AND circuit 24 to a high electric potential. The signal line 104 is reset when the signal line 111 is made to a high electric potential. The slice level SL is, as shown in FIG. 3, a mean value of the amounts of the secondary electron signals which the retarding voltage of the energy analyzer 9 (FIG. 2) has sampled by $+20$ V and $-20$ V, the conversion coefficient $\alpha$ is a reciprocal of an inclination of an analyze curve at a crosspoint of the slice level and the analyze curve. A data setting means from the control apparatus 3 to Reg. 6, Reg. 7 and deciding means for deciding the slice level SL and the conversion coefficient $\alpha$ and means for resetting the signal line 104 are omitted.

The retarding voltage control circuit 14 is brought to the retarding voltage setting mode when the signal line 121 from the random address generator 16 receives a strobe, and the content of Reg 5 specified by the relative address data 122 is DA converted to be made to the retarding voltage 163 for the energy analyzer 9 (FIG. 2). When the value of the retarding voltage 163 is set, the signal line 123 for the AND circuit 30 is made to a high electric level. The signal line 123 is reset when the signal line 125 is made to the high electric level. Reset means for the signal line 123 is omitted.

Next, the retarding voltage control circuit 14 receives a strobe from the signal line 135 from the phase scanning counter circuit 21, and is brought to a retarding voltage renewal mode. In the retarding voltage renewal mode, a strobe is generated, in order, to the secondary electron signal read request 136 for the secondary electron signal processing circuit 13, the secondary electron signal data 137 is read, and the content of Reg 5 is renewed according to the following equation.

$$V_R(I)' = V_R(I) - \alpha(S(I) - SL) \quad (1)$$

$$I = 0, \ldots, 255$$

$V_R(I)$ is the retarding voltage data of Reg 5 specified by the address I, and $S(I)$ is the secondary electron signal data of Reg 4 specified by the address I.

When the renewal of the content of Reg 5 is ended, the retarding voltage control circuit 14 makes the signal line 138 for the AND circuits 31 and 33 to a high electric potential, then it becomes the retarding voltage read mode. The signal line 138 is reset when the signal line 150 or the signal line 140 has a high electric potential. Reset means of the signal line 138 is omitted. When the mode is switched to the retarding voltage read mode and the strobe is received for the first time from the retarding voltage data processing circuit 17 to the retarding voltage read request 152, the content of the register specified by the address 0 in Reg 5 appears at the retarding voltage data 153. Hereinafter, when the retarding voltage read request 152 receives the strobe, the data of the register Reg 5 specified by the address incremented by a prior address is sent via the retarding voltage data 153 to the retarding voltage data processing circuit 17.

Figure 29:
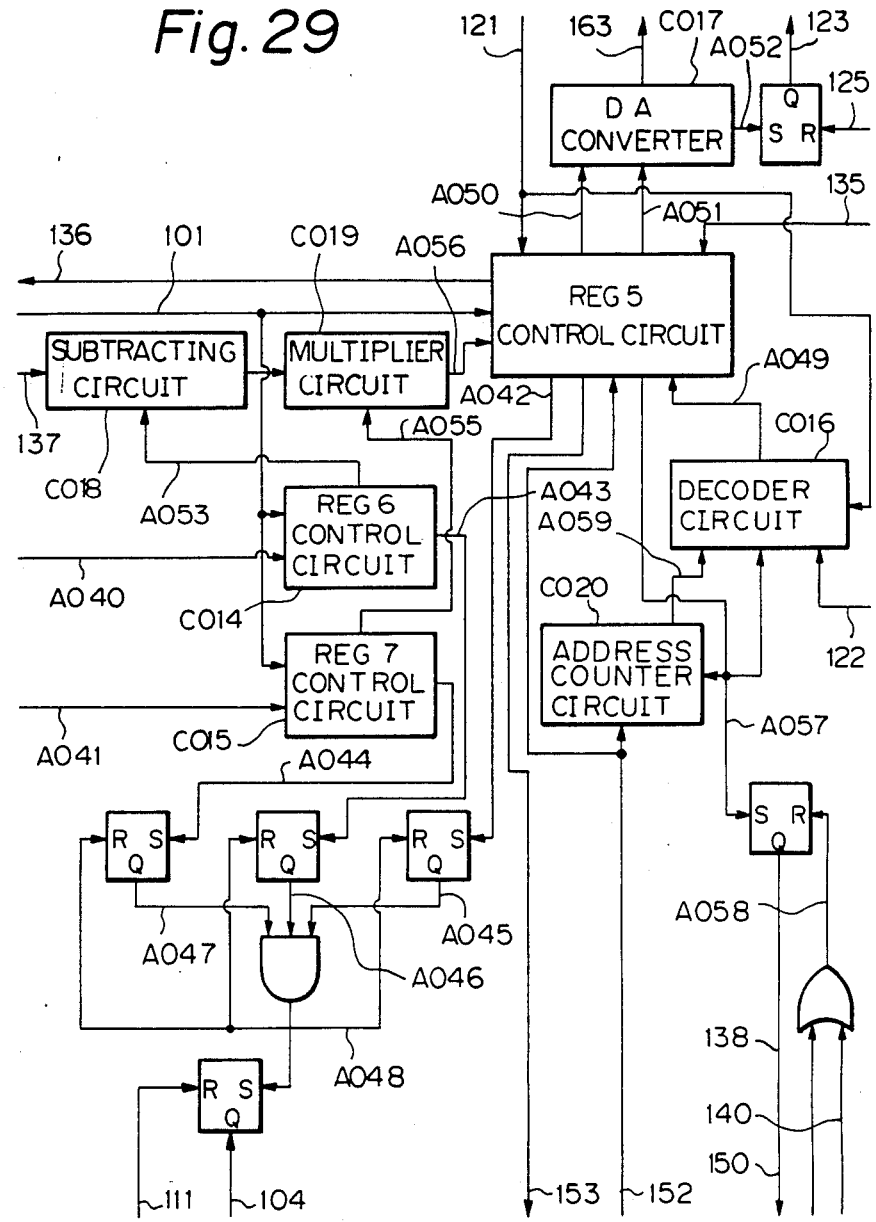
FIG. 29 is a block diagram of an internal construction of the retarding voltage control circuit 14 shown in in FIG. 1.

{Explanation of an internal construction of the retarding voltage control circuit 14 (FIG. 29)}

The following is an explanation of the internal construction of the retarding voltage control circuit 14.

The retarding voltage control circuit 14 is formed by a Reg 5 control circuit C013 including the Reg 5 and the peripheral circuit thereof, a Reg 6 control circuit C014 including the Reg 6 and the peripheral circuit thereof, a Reg 7 control circuit C015 including the Reg 7 and the peripheral circuit thereof, a decoder circuit C016, a DA conversion circuit C017, a subtracting circuit C018, a multiplier circuit C019, an address counter C020, an AND gate, an OR gate, and an RS flip-flop circuits.

When the Reg 5 control circuit C013 receives a strobe to the signal line 121, it makes an initial value of 256 retarding voltage data in Reg 5 0 volt, and thereafter, generates a strobe to the signal line A042. When the circuit C013 receives a strobe to the signal line 121, it is set to a retarding voltage setting mode. In the retarding voltage setting mode, the circuit C013 sets the retarding voltage data stored in each register of the Reg 5 specified by the address data A049 to the signal line A050, and after the set value is stabilized, the DA conversion request strobe is generated to the signal line A051.

When the circuit C013 receives a strobe to the signal line 135, it is set to a retarding voltage renewing mode. in the retarding voltage renewing mode, the circuit C013 generates, in order, the strobe to the signal line 136 and for the strobe, subtracts the value appearing in the signal line A056 from the content in each registers in Reg 5. That is, for the strobe issued at (i) times to the signal line 136, the value appearing in the signal line A056 is subtracted from the register in Reg 5 specified by an address i-1, so that the retarding voltage data is renewed.

When the circuit C013 generates strobe 256 times to the signal line 136 and changes the content of 256 registers in Reg 5, it generates a strobe to the signal line A057 so that it is set to the retarding voltage reading mode.

In the retarding voltage reading mode, when the circuit C013 receives a strobe from the signal line 152, it sets the retarding voltage data stored in each register in Reg 5 specified by the address data A049 to the signal line 153.

When the Reg 6 control circuit C014 receives a strobe from a start signal 101, it receives a slice level from the control apparatus via a signal line A040, stores its value in the Reg 6, and generates a strobe to the signal line A043.

The content of Reg 6 appears in the signal line A053. The signal line A040 is not shown in FIG. 1.

When the Reg 7 control circuit C015 receives a strobe from the starting signal 101, it receives a conversion coefficient α from the control apparatus via the signal line A041, sets its value to Reg 7, and thereafter, generates a strobe to the signal line A044.

The content of Reg 7 appears in the signal line A055. The signal line A041 is not shown in FIG. 1.

When a signal line 104 receives a strobe to the signal line A042, it receives a strobe to the signal line A043, and receives a strobe to the signal line A044, is made to a high electric potential, and when it receives a strobe to the signal line 111, is made to a low electric potential. The signal line 111 is not shown in FIG. 1.

When the decoder circuit C016 receives a strobe from the signal line 121, it sets a relative address data set in the signal line 122 to a signal line A049.

When the circuit C016 receives a strobe from the signal line A057, it sets the value of the address counter set in the signal line A059 to a signal line A049.

When the DA conversion circuit C017 receives a DA conversion request strobe to the signal line A051, it receives the retarding voltage data from the signal line A050, DA converts the same, and sets it to the signal line 163. The DA conversion circuit generates a strobe to the signal line A052 after the signal line 163 is stabilized.

When the signal line 123 receives a strobe from the signal line A052, it is made to a high electric potential, and when it receives a strobe from the signal line 125, it is made to a low electric potential. The signal line 125 is not shown in FIG. 1.

The subtracting circuit C018 subtracts the value of the slice level set in the signal line A053 from the secondary electron signal data 137, and writes the result thereof in the signal line A05.

The multiplier circuit C019 multiplies the value of the conversion coefficient α set in the signal line A055 with the data received from the signal line A054 and writes the result thereof in the signal line A056.

The address counter circuit C020 has an address counter having an 8 Bit depth. When the circuit C020 receives a strobe from the signal line A057, it clears an address counter. When the address counter circuit receives a strobe to the signal line 252, it increments the address counter after a suitable delay. Preferably, the time has a value longer than that required for writing the retarding voltage data in the signal line 153 by the Reg 5 control circuit, for the strobe in the signal line 152.

The content of the address counter always appears in the signal line A059.

When the signal line 138, receives a strobe to the signal line A057, it is made to a high electric potential, and when it receives a strobe to the signal line 140 or the signal line 150, it is made to a low electric potential. The signal line 140 and the signal line 150 are not shown in FIG. 1.

{Explanation of the operation of the phase control circuit 15 (FIG. 1, FIG. 16, and FIG.17)}

Hereinafter, the operation of the phase control circuit 15 will be explained. In thephase control circuit 15, as shown in FIG. 16, there is a group of registers Reg 8 of 256 specified by the address 0~255 having a 16 Bit depth. When the phase control circuit 15 receives the strobe from the starting signal 101, Reg 8 is initialized in the form shown in FIG. 17. $\phi_{ini}$, $\phi_{stp}$ are an initial phase and a phase step of the measured waveform specified by 100 ps units, respectively. When the initialization of Reg 8 is ended, the signal line 106 for the AND circuit 24 is made to a high electric potential. The signal line 106 is reset when the signal line 111 is made to a high electric potential. The initializing means for Reg 8 and the reset means for the signal line 106 are omitted. When the phase control circuit 15 receives the strobe from the signal line 121, the content of Reg 8 shown by a relative address data 122 from the random address generator 16 is sent to the phase data 161, and thereafter, the signal line 124 for the AND circuit 30 is made to a high electric potential. The signal line 124 is reset when the signal line 125 is made to the high electric potential. The reset means for the signal line 124 is omitted.

Figure 30:
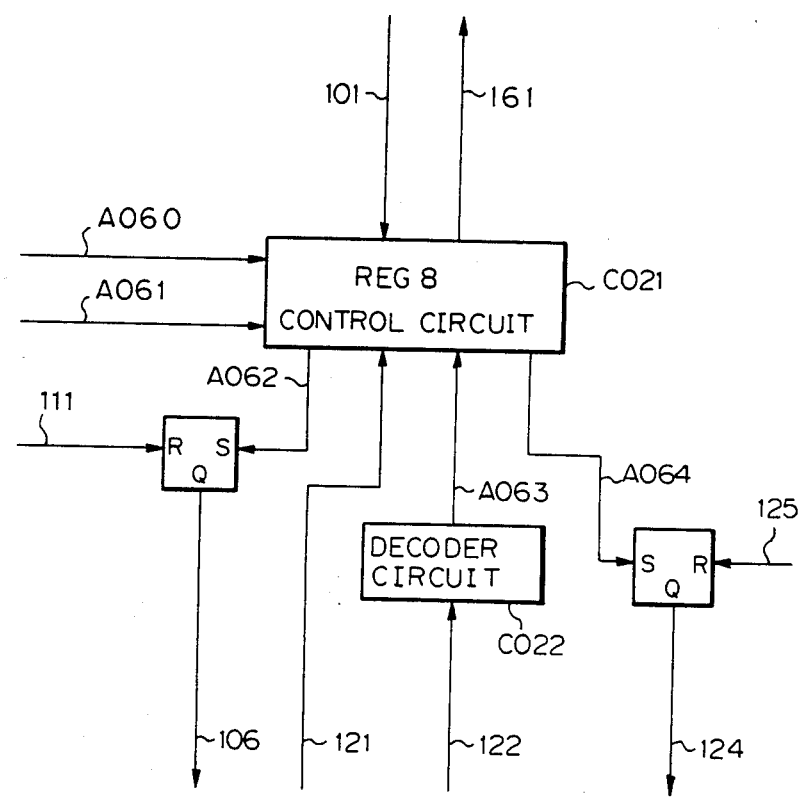
FIG. 30 is a block diagram of an internal construction of the phase control circuit 15 shown in FIG. 1.

{Explanation of the internal construction of the phase control circuit 15 (FIG. 30)}

The following is an explanation of the internal construction of the phase control circuit 15.

The phase control circuit 15 is formed by a Reg 8 control circuit C021 including the Reg 8 and a peripheral circuit thereof, a decoder circuit C022 and flip-flop circuits.

When the Reg 8 control circuit C021 receives a strobe from the signal line 101, it initializes Reg 8 to a form shown in FIG. 17, and thereafter, generates a strobe to the signal line A062. An initial phase $\phi_{ini}$ is read via a signal line A060 from the control apparatus 3, and a phase step $\phi_{stp}$ is read via a signal line A061 from the control apparatus. The signal line A060 and the signal line A061 are not shown in FIG. 1.

When the signal line 106 receives a strobe from the signal A062, it is made to a high electric potential, and when it receives strobe from the signal line 111, it is made to a low electric potential. The signal line 111 is not shown in FIG. 1.

When the Reg 8 control circuit C021 receives a strobe from the signal line 121, it reads the phase data stored in each register of the Reg 8 specified by the address of the signal line A063 to the signal line 161. After the phase data is stabilized, the circuit C021 generates a strobe to the signal line A064.

When the signal line 124 receives a strobe from the signal line A064, it is made to a high electric potential, and when it receives a strobe from the signal line 125, it is made to a low electric potential. The signal line 125 is not shown in FIG. 1.

The decoder circuit C022 converts the address data of the signal line 122 to match the Reg 8 and writes the result thereof in the signal line A063.

{Explanation of the operation of the random address generator 16 (FIG. 1 and FIG. 18)}

Hereinafter, the operation of the random address generator 16 will be explained. In the random address generator 16, as shown in FIG. 18, there is a group of registers Reg 9 of 512 specified by the address 0~511 having a 8 Bit depth, and pointer registers Reg 10, Reg 11, Reg 12 having a 9 Bit depth. When the random address generator 16 receives a strobe from the starting signal 101, the random address generator 16 writes a data in which the values 0~255 previously generated at the control apparatus 3 is randomly combined with the portion which is specified by the addresses 0~255 of Reg 9, and after that Reg 10 is set 0, Reg 11 is set at 256, Reg 12 is set at 511, and the signal line 105 for the AND circuit 24 is made to a high electric potential. When the signal line 111 is made to the high electric potential, the signal line 105 is reset.

The data setting means for Reg 9 and the resetting means for the signal line 105 are omitted.

When the signal line 116 receives a strobe from the OR circuit 27, the random address generator 16 makes the signal line 117 to the AND circuit 28 is made to a high electric potential. The signal line 117 is reset when the signal line 119 is brought to the high electric potential. The resetting means for the signal line 117 is omitted. When the signal line 133 from the phase scanning counter circuit 21 receives the strobe, the random address generator 16 makes, if the value of Reg 10 at this time is 256, Reg 10=256, Reg 11=0, and Reg 12=255, and if the value of Reg 10 at this time is 256, Reg 10=0, Reg 11=256, and Reg 12=511, and thereafter, generates the strobe to the signal line 134 for the OR circuit 27. When the random address generator 16 receives a strobe at the signal line 120 from the OR circuit 29, the random address generator 16 sets the data read from Reg 9 to the relative address data 122 by using the added content of the address data 131 and the content of Reg 10 as an address, and thereafter, generates a strobe to the signal line 121. When the random address generator 16 receives a strobe from the secondary electron signal adding circuit 11 to the signal line 128, if the LSB data 127 is 1, the random address generator 16 writes the address data 122 in a register in the Reg 9 specified by Reg 11 as an address so as to increment Reg 11, and if the LSB data 127 is 0, the random address generator 16 writes the relative address data 122 in a register in the Reg 9 specified by Reg 12 as an address so as to decrement the Reg 12, and generates the strobe to the signal line 129 for the phase feeding counter circuit 20.

Figure 31:
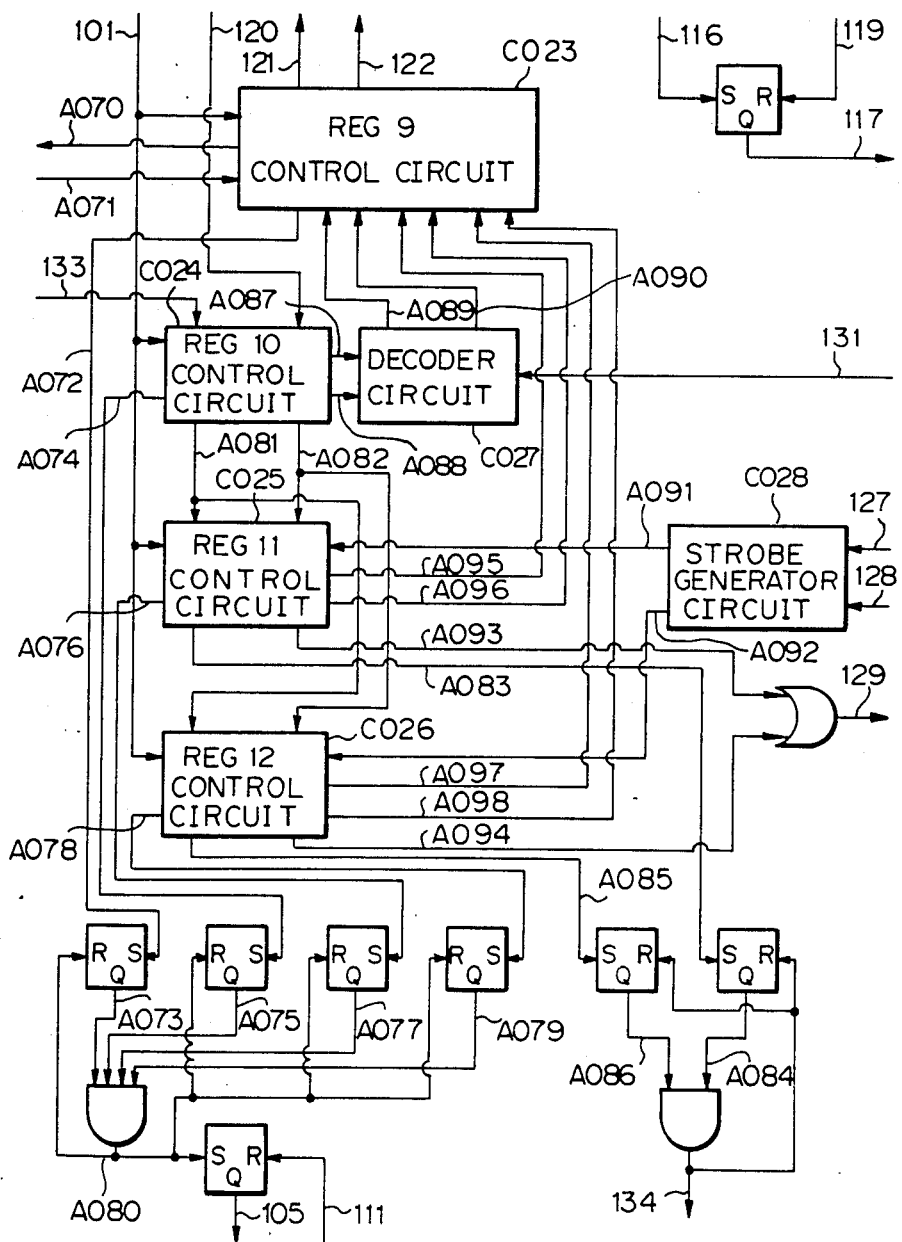
FIG. 31 is a block diagram of an internal construction of the random address generator 16 shown in FIG. 1.

{Explanation of an internal construction of the random address generator 16 (FIG. 31)}

The following is an explanation of the internal construction of the random address generator 16.

The random address generator 16 is formed by a Reg 9 control circuit C023 including a Reg 9 and a peripheral circuit thereof, a Reg 10 control circuit C024 including a Reg 10 and a peripheral circuit thereof, a Reg 11 control circuit C025 including a Reg 11 and a peripheral circuit thereof, a Reg 12 control circuit C026 including a Reg 12 and a peripheral circuit thereof, a decoder circuit C027, a strobe generator circuit C028, AND gates, an OR gate, and flip-flop circuits.

When the Reg 9 control circuit C023 receives a strobe from the start signal 101, it requests a write of random data, via the signal line A070, from the control apparatus 3. The circuit C023 reads the data which the control apparatus 3 sends to the signal line A071 for the strobe in the signal line A070 to the address data Reg 9 as push up. When 256 registers from the top of Reg 9 are filled with the data of the signal line A071, the circuit C023 generates a strobe to the signal line A072, and when 256 registers are not full, generates a strobe to the signal line A070 again.

When the circuit C023 receives a strobe to the signal line A090, it sets the data read from the Reg 9 to a relative address data 122 by using the data from the signal line A089 as an address, and thereafter, generates a strobe to the signal line 121.

When the circuit C023 receives a strobe to the signal line A096, it sets the relative address of the signal line 122 to a register in Reg 9 specified by the data received from the signal line A095 as the address.

When the circuit C023 receives a strobe to the signal line A098, it writes a relative address of the signal line 122 to a register in Reg 9 specified by using the data received from the signal line A097 as an address. The signal lines A074, A070 are not shown in FIG. 1.

When the Reg 10 control circuit C024 receives a strobe from the signal line 101, it clears a base address pointer Reg 10, and thereafter, generates a strobe to a signal line A074.

When the circuit C024 receives a strobe from the signal line 120, it writes a content of Reg 10 to the signal line A087, and thereafter, generates a strobe to a signal line A088.

When the circuit C024 receives a strobe from the signal line 133, if the content of Reg 10 is zero, it makes a content of Reg 10 256, and thereafter, generates a strobe to the signal line A081.

When the circuit C024 receives a strobe from the signal line 133, if the content of Reg 10 is 256, it makes a content of Reg 10 zero, and thereafter generates a strobe to the signal line A082.

When the Reg 11 control circuit C025 receives a strobe from the signal line 101, it makes the content of Reg 11 256, and thereafter, generates a strobe to the signal line A076.

When the circuit C025 receives a strobe from the signal line A081, it makes the content of Reg 1 10, and thereafter, generates a strobe to the signal line A083.

When the circuit C025 receives a strobe from the signal line A082, it makes the content of Reg 11 256, and thereafter, generates a strobe to the signal line A083.

When the circuit C025 receives a strobe from the signal line A091, it writes the content of Reg 11 in the signal line A095, generates a strobe to the signal line A096, and thereafter, increments the content of Reg 11 by 1.

When the Reg 12 control circuit C026 receives a strobe from the signal line 101, it makes the content of Reg 12 511, and thereafter, generates a strobe to the signal line A076.

When the circuit C026 receives a strobe from the signal line A081, it makes the content of Reg 12 255, and thereafter, generates a strobe to the signal line A085.

When the circuit C026 receives a strobe from the signal line A082, it makes the content of Reg 12 511, and thereafter, generates a strobe to the signal line A085.

When the circuit C026 receives a strobe from the signal line A092, it writes the content of Reg 12 in the signal line A097, generates a strobe to the signal line A098, and thereafter, increments the content of Reg 12 by 1.

When the signal line 105 receives a strobe to the signal line A072, it also receives a strobe to the signal line A074, a strobe to the signal line A076, and a strobe to the signal line A078, it is made to a high electric potential, and when it receives a strobe to the signal line 111, it is made to a low electric potential. The signal line 111 is not shown in FIG. 1.

When the Reg 11 control circuit C025 generates a strobe to the signal line A083, and the Reg 12 control circuit C026 generates a strobe to the signal line A085, the strobe is generated to the signal line 134.

When the decoder circuit C027 receives a strobe from the signal line A088, it adds the content of Reg 10 appearing in the signal line A087 and an address data of a signal line 131, writes the value thereof in the signal line A089, and thereafter, generates a strobe to the signal line A090.

If LSB data of the signal line 127 is zero, when the strobe generator circuit C028 receives a strobe from the signal line 128, it generates a strobe to the signal line A092.

If LSB data of the signal line 127 is 1, when the circuit C028 receives a strobe from the signal line 128, it generates a strobe to a signal line A091.

When the signal line 117 receives a strobe to the signal line 116, it is made to a high electric potential, and when it receives a strobe to the signal line 119, it is made to a low electric potential. The signal line 119 is not shown in FIG. 1.

{Explanation of the operation of the retarding voltage data processing circuit 17 (FIG. 1 and FIG. 19)}

The following is an operation of the retarding voltage data processing circuit 17. In the retarding voltage data processing circuit 17, as shown in FIG. 19, there is a group of registers Reg 13 of 256 specified by the addresses 0~255 having a 32 Bit depth, and Reg 14 having an 8 Bit depth. Reg 13 is a register for integrating and storing the retarding voltage in each phase scanning. The retarding voltage data processing circuit 17 clears Reg 13, Reg 14 when the starting signal 101 receives the strobe, and makes the signal line 107 for the AND circuit 24 to a high electric potential. The signal line 107 is reset when the signal 111 is at a high electric potential. The reset means for the signal line 107 is omitted. When the strobe is received from the signal line 151 from the OR circuit 32, the retarding voltage data processing circuit 17 generates in order the strobe to the retarding voltage read request 152, reads each retarding voltage data 153 from the Reg 5 in the retarding voltage control circuit 14, and renews the content of Reg 13 in accordance with the following equation.

$$V_R\text{sum}(I)' = V_R\text{sum}(I) + V_R(I) \tag{2}$$

$$I = 0, \ldots, 255$$

$V_R$sum is a content of each Reg 13 of 256 (the added value of the retarding voltage data), $V_R$ is a content of each Reg 5 of 256, and I is an address for specifying the data of 256 of Reg 5, Reg 13. When the renewal of the Reg 13 ends, the retarding voltage data processing circuit 17 increments Reg 14, and generates a strobe to the signal line 154 for the analyzed voltage adding counter circuit 23. The content of the Reg 13 becomes a final measured value of the retarding voltage and can be read from the control apparatus 3, here, however, this means is omitted.

Figure 32:
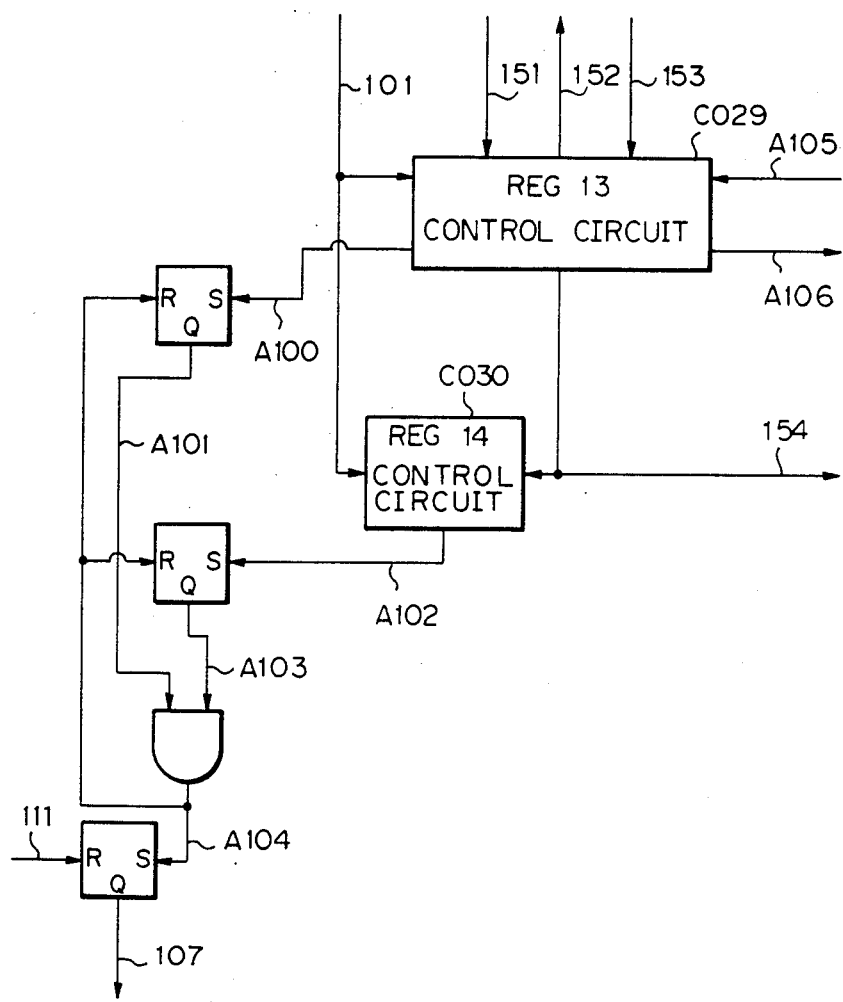
FIG. 32 is a block diagram of an internal construction of the analyzed voltage data processing circuit 17 shown in FIG. 1.

{Explanation of an internal construction of the retarding voltage data processing circuit 17 (FIG. 32)}

The following is an explanation of the internal construction of the retarding voltage data processing circuit 17.

The retarding voltage processing circuit 17 is formed by a Reg 13 control circuit C029 including Reg 13 and the peripheral circuit thereof, a Reg 14 control circuit C030 including Reg 14 and a peripheral circuit thereof, an AND gate, and a flip-flop circuits.

When the Reg 13 control circuit C029 receives a strobe from the start signal 101, it clears the added value Reg 13 of the retarding voltage data, and thereafter, generates a strobe to the signal line A100.

When the circuit C029 receives a strobe to the signal line 151, it generates a strobe to the retarding voltage data read request 152, in order, reads the retarding voltage data 153, in order, from the Reg 5 in the retarding voltage control circuit 14, and changes the content of Reg 13 according to the equation (2) already mentioned. When the change of the content of Reg 13 is completed, a strobe is generated to the signal line 154.

When the circuit C029 receives a strobe from the control apparatus 3 to the signal line A105, it sends the retarding voltage data added value of Reg 13 to the signal line A106 for the control apparatus 3, in order. The signal line A105 and the signal line A106 is not shown in FIG. 1.

When the Reg 14 control circuit C030 receives a strobe from the start signal 101, it clears the adding times counter Reg 14, and thereafter, generates a strobe to the signal line A102. When the circuit C030 receives a strobe to the signal line 154, it increments the adding times counter Reg 14 by 1.

When the signal line 107 receives a strobe to the signal line A100, and receives a strobe to the signal line A102, it is made to a high electric potential, and when it receives a strobe to the signal line 111, is made to a low electric potential. The signal line 111 is not shown in FIG. 1.

{Explanation of the conversion judgment circuit 18 (FIG. 1 and FIG. 20)}

The following is an explanation of the conversion judgment circuit 18. In the conversion judgment circuit 18, as shown in FIG. 20, there is a register Reg 15 having a 32 Bit depth for storing the value of a first conversion judgment value $V_{conv}$ of the retarding voltage, a 32 Bit Register Reg 16 for storing the conversion coefficient $\alpha$, and a 32 Bit Register Reg 17 for storing a slice level SL. When the starting signal 101 receives a strobe, the conversion judgment circuit 18 reads the first conversion judged values $V_{conv}$ of the retarding voltage from the control apparatus 3 to Reg 15, the conversion coefficient $\alpha$ to Reg. 16, the slice level SL to Reg 17, and thereafter makes the signal line 109 for the AND circuit 24 to a high electric potential. The signal line 109 is reset when the signal line 111 is made to the high electric potential. The reset means for the signal line 109 and the data setting means for the Reg 15~Reg 17 are omitted. When the conversion judgment circuit 18 receives the strobe from the signal line 140 from the AND circuit 33, the conversion judgment circuit 18 generates a strobe, in order, to the signal line 141 for the secondary electric signal processing circuit 13, reads the secondary electron signal data 142 of 256 from Reg 4, and calculates a primary conversion error $V_{err}$ 1 of the retarding voltage in accordance with the following equation.

$$V_{err1} = 3 \cdot \left[ \frac{1}{2} \cdot \sum_{I=0}^{255} (\alpha(S(I) - SL))^2 / 255) \right]^{\frac{1}{2}} \quad (3)$$

here, S(I) is a content of the register in Reg 4 specified by the address I. When $V_{err1} > V_{conv}$, the conversion judgment circuit 18 writes the value of $V_{err1}$ to a retarding voltage precision data 145 for the repeating times setting circuit 19, and thereafter, generates a strobe to a conversion flag set request 144 for the conversion flag setting circuit 22. When $V_{err1} > V_{conv}$, it generates a strobe to the signal line 143 for the OR circuit 25.

Figure 33:
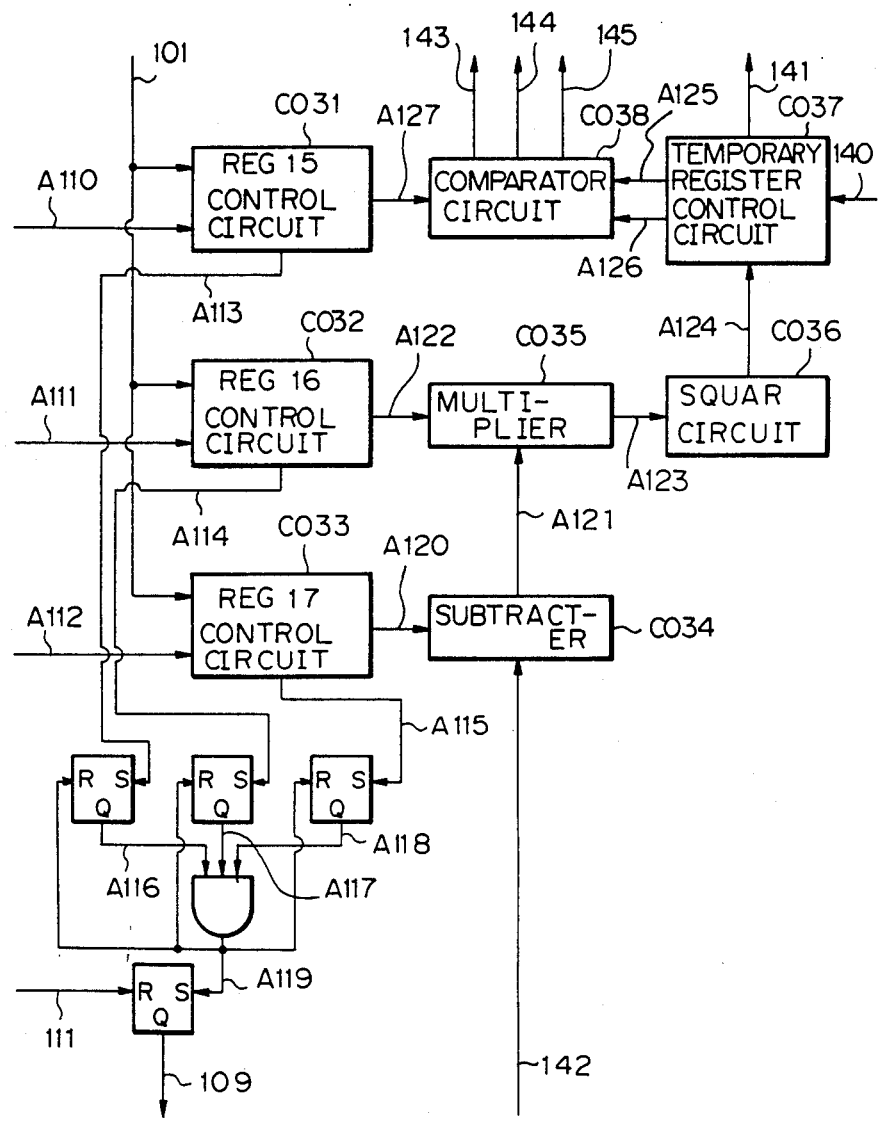
FIG. 33 is a block diagram of an internal construction of the conversion judgment circuit 18 shown in FIG. 1.

{Explanation of an internal construction of the conversion judgment circuit 18 (FIG. 33)}

The following is an explanation of the internal construction of the conversion judgment circuit 18.

The conversion judgment circuit is formed by a Reg 15 control circuit C031 including Reg 15 and a peripheral circuit thereof, a Reg 16 control circuit C032 including Reg 16 and the peripheral circuit thereof, a Reg 17 control circuit C033 including Reg 17 and a peripheral circuit thereof, a subtracting circuit C034, a multiplier circuit C035, a square law circuit C036, a temporary register control circuit C037, a comparator circuit C038, an AND gate, and RS flip-flop circuits.

When the Reg 15 control circuit C031 receives a strobe from the start signal 101, it sets a first conversion judgment value to Reg 15 via the signal line A110 from the control apparatus 3, writes $V_{conv}$ in the signal line A127, and thereafter, generates a strobe to the signal line A113.

The signal line A110 is not shown in FIG. 1.

When the Reg 16 control circuit C032 receives a strobe from the start signal 101, it sets a conversion coefficient $\alpha$ $V_{conv}$ to Reg 16 via the signal line A111 from the control apparatus 3, writes $\alpha$ in the signal line A122, and thereafter, generates a strobe to the signal line A114.

The signal line A111 is not shown in FIG. 1.

When the Reg 17 control circuit C033 receives a strobe from the start signal 101, it sets a slice level SL to Reg 17 via the signal line A112 from the control apparatus 3, writes SL in the signal line A120, and thereafter, generates a strobe to the signal line A115.

The signal line A112 is not shown in FIG. 1.

When the signal line 109 receives a strobe to the signal line A113, it receives a strobe to the signal line A114 and receives a strobe to the signal line A115, it is made to a high electric potential, and when it receives a strobe to the signal line 111, it is made to a low electric potential. The signal line 111 is not shown in FIG. 1.

When the subtracting circuit C034 receives a secondary electron signal data 142 from the secondary electron signal processing circuit 13, it subtracts the slice level SL appearing in the signal line A120 from the secondary electron signal data and writes the result of the operation in the signal line A121.

When the multiplier circuit C035 receives a result of the operation A121 from the subtracting circuit C034, it multiplies the conversion coefficient $\alpha$ appearing in the signal line A122 to the result of the operation and writes the same in the signal line A123 as the new result thereof.

When the square law circuit C036 receives a result of the operation A123 from the multiplier circuit C035, it makes square the result of the operation and writes the same in the signal line A124 as the new result thereof.

When the temporary register control circuit C037 receives a strobe from the signal line 140, it clears the temporary register which stores the temporary data for determining the first conversion error $V_{err1}$, and thereafter, generates a strobe to the signal line 141, and requests a write operation of the secondary electron signal data 142 for the secondary electron signal processing circuit 13.

The circuit C037 adds the operated result from the signal line A124, and thereafter, again generates a strobe to the signal line 141.

The circuit C037 receives a strobe from the signal line 140, adds 256 times the result received from the signal line A124 to the temporary register, and thereafter writes the content of the temporary register in the signal line A126. After the signal line A126 is stabilized, the circuit C037 generates a compare request strobe to the signal line A125.

When the comparator circuit C038 receives the compare request strobe at the signal line A125, it calculates, from the data of the signal line A126, $V_{err1}$ in the equation (3) already shown.

Next, the circuit C038 compares $V_{err1}$ with the value of the first conversion judgment value $V_{conv}$ set in the signal line A127. At this time, when $V_{err1} \leq V_{conv}$, the circuit C038 writes $V_{err1}$ in the signal line 145, and after the signal line 145 is stabilized, generates a strobe to the signal line 144.

When $V_{err1} > V_{conv}$, the circuit C038 generates a strobe to the signal line 143.

{Explanation of the repeating times setting circuit 19 (FIG. 1 and FIG. 21)}

The following is an explanation of the operation of the repeating times setting circuit 19. In the repeating times setting circuit 19, as shown in FIG. 21, there is a 32 Bit register Reg 18 for storing the secondary conversion error $V_{err2}$ for the voltage measurement accuracy which is necessary in the measurement of the voltage waveform. When the repeated setting circuit 19 receives a strobe from the starting signal 101, the repeating times setting circuit 19 reads $V_{err2}$ from the control apparatus 3 to Reg 18, and thereafter, makes the signal line 110 for the AND circuit 24 to a high electric potential. The signal line 110 is reset when the signal line 111 is made to the high electric potential. The reset means for the signal line 110 and the data setting means for Reg 18 are omitted. When receiving the strobe to the signal line 146 from the conversion flag setting circuit 22, the repeating times setting circuit 19 reads a primary conversion error $V_{err1}$ from a retarding voltage precision data 145 from the conversion judgment circuit 18, determines the number of times K is repeated in accordance with the following equation (4), $$K = (V_{err1}/V_{err2})^2 \qquad (4).$$

And thereafter, makes, K an integer by raising fractions. Next, K is written in the repeated data 147 for the retarding voltage adding counter circuit 23 and the strobe is generated to the signal line 148. At this time, K is also sent to the control apparatus 3, but here the means thereof are omitted.

Figure 34:
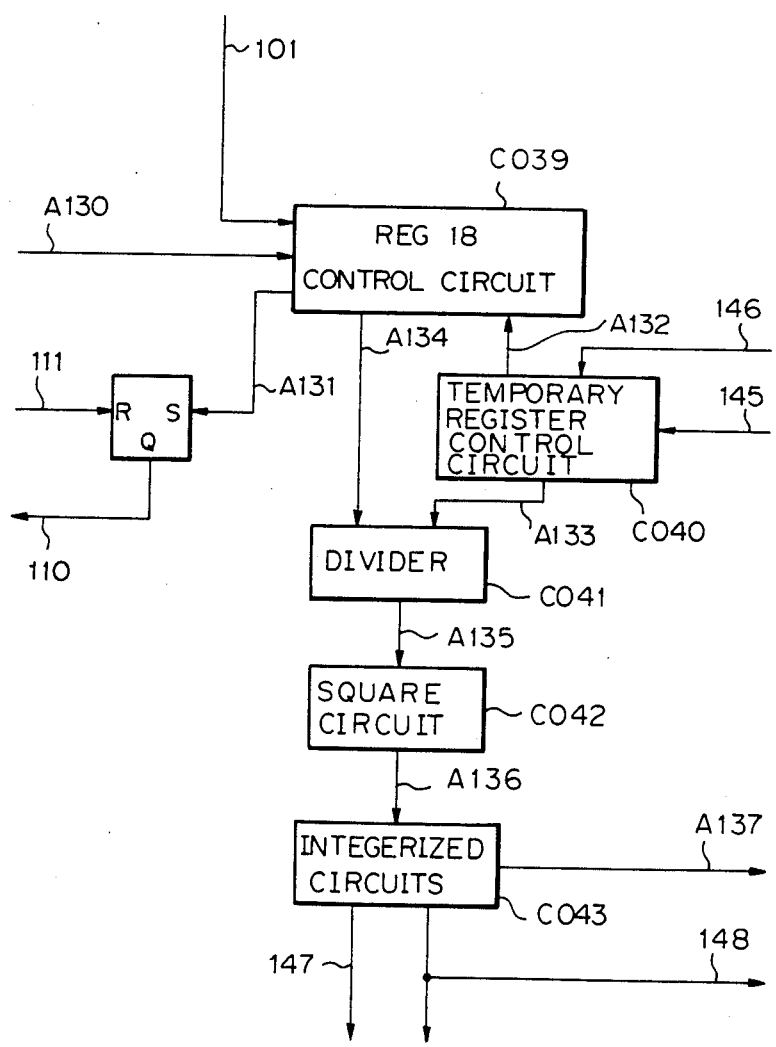
FIG. 34 is a block diagram of an internal construction of the repeating times setting circuit 19 shown in FIG. 1.

{Explanation of an internal construction of the repeat times setting circuit 19 (FIG. 34)}

The following is an explanation of the repeat time setting circuit 19.

The repeat time setting circuit 19 is formed by a Reg 18 control circuit C039 including a Reg 18 and a peripheral circuit thereof, a temporary register control circuit C040 including a temporary register for storing the first conversion error $V_{1\,err}$ from the conversion judgment circuit 18, and a peripheral circuit thereof, a divider circuit C041, a square-law circuit C042, an integer circuit C043, and a flip-flop circuit.

When the Reg 18 control circuit C039 receives a strobe at the signal line 101, it reads the secondary conversion error $V_{err2}$ to the Reg 18 via the signal line A130 from the control apparatus 3, and generates a strobe to the signal line A131. The signal line A130 is not shown in FIG. 1.

When the circuit C039 receives a strobe to the signal line A132, it writes the secondary conversion error $V_{err2}$ to the signal line A134 from Reg 18.

When the signal line 110 receives a strobe to the signal line A131, it is made to a high electric potential, and when it receives a strobe from the signal line 111, it is made to a low electric potential. The signal line 111 is not shown in FIG. 1.

When the temporary register control circuit C040 receives a strobe at the signal line 146, it reads the primary conversion error $V_{err1}$ to the temporary register via the signal line 145 from the conversion judgment circuit 18. Thereafter, the temporary register control circuit C040 writes the data in the temporary register to the signal line A133, and thereafter, generates a strobe to the signal line A132.

When the divider circuit C041 reads the primary conversion error $V_{err1}$ from the signal line A133 and the secondary conversion error $V_{err2}$ from the signal line 134, it divides $V_{err2}$ by $V_{err1}$ and generates the result thereof to the signal line A135.

When the square-law circuit C042 receives the operation result of the divider circuit C041 from the signal line A135, it determines the squared value thereof, and writes the same in the signal line A136 as a new operation result.

When the integer circuit C043 receives the operation result of the square-law circuit C042 from the signal line A136, it converts the value thereof to an integer by raising the fractions, and writes the same in the signal line 147 and the signal line A137 for the control apparatus 3 as a new operation result, and thereafter, generates a strobe to the signal line 148. The signal line 137 is not shown in FIG. 1.

{Explanation of operation of the phase feeding counter circuit 20 (FIG. 1 and FIG. 22)}

The following is an explanation of the operation of the phase feeding counter circuit 20. In the phase feeding counter circuit 20, as shown in FIG. 22, there is an 8 Bit counter register Reg 19 and a 1 Bit overflow flag register Reg 20 for representing the overflow of the counter register Reg 19. When the phase feeding counter circuit 20 receives a strobe from a signal line 115 from the AND circuit 26, the phase feeding counter circuit 20 clears Reg 19, Reg 20, and thereafter, makes the signal line 118 for the AND circuit 28 to a high electric potential. The signal line 118 is reset when the signal line 119 is made to the high electric potential. The reset means for the signal line 118 is omitted. When receiving the strobe to the signal line 129 from the random address generator 16, if the overflow flag Reg 20 is set, the phase feeding counter circuit 20 generates a strobe to the signal line 132 for the phase scanning counter circuit 21, and if the overflow flag Reg 20 is not set, the phase feeding counter circuit 20 sets the content of Reg 19 to the address data 131 for the random address generator circuit 16, and thereafter, generates a strobe to the signal line 130 for the OR circuit 29 and increments Reg 19, and if an overflow occurs in Reg 19, sets the overflow flag to Reg 20.

Figure 35:
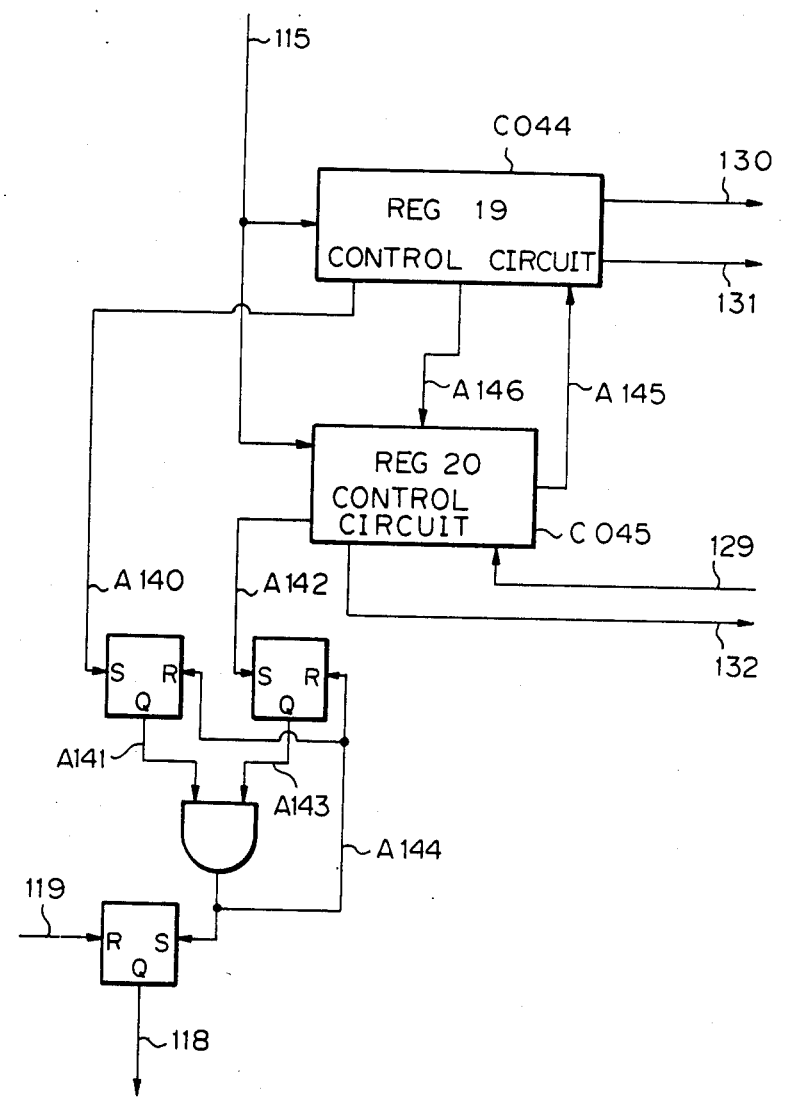
FIG. 35 is a block diagram of an internal construction of the phase feeding counter circuit 20 shown in FIG. 1.

{Explanation of an internal construction of the phase feeding counter circuit 20 (FIG. 35)}

The following is an explanation of the internal construction of the phase feeding counter circuit 20.

The phase feeding counter circuit 20 is formed by a Reg 19 control circuit C044 including a Reg 19 and a peripheral circuit thereof, a Reg 20 control circuit C045 including a Reg 20 and a peripheral circuit thereof, an AND gate, and flip-flop circuits.

When the Reg 19 control circuit C044 receives a strobe at the signal line 115, it clears the phase feeding counter Reg 19, and thereafter, generates a strobe to the signal line A140.

When the circuit C044 receives a strobe to the signal line A145, it sets the content of the phase feeding counter Reg 19 to the signal line 131, and subsequently, generates a strobe to the signal line 130. After generating a strobe to the signal line, the circuit C044 increments the content of Reg 19 by 1. At this time, when Reg 19 overflows, the circuit C044 generates a strobe to the signal line A146.

When the Reg 20 control circuit C045 receives a strobe to the signal line 115, it clears the overflow flag Reg 20, and thereafter, generates a strobe to the signal line A142.

When the circuit C045 receives a strobe at the signal line 129, and if the overflow flag is set, generates a strobe to the signal line 132, and when it receives a strobe to the signal line 129 and if the overflow flag is not set, generates a strobe to the signal line A145. The overflow flag Reg 20 is set when the strobe is received from the signal line A146.

When the signal line 118 receives a strobe to the signal line A140 and receives a strobe to the signal line A142, it is made to a high electric potential, and when it receives a strobe to the signal line 119, it is made to a low electric potential.

The signal line 119 is not shown in FIG. 1.

{Explanation of operation of the phase scanning counter circuit 21 (FIG. 1 and FIG. 23)}

The following is an explanation of the phase scanning counter circuit 21. In the phase scanning counter circuit 21, as shown in FIG. 23, there is a 16 Bit register 21 for setting the number of scannings of the phase J and a counter Reg 22 for scanning the phase. When the phase scanning counter circuit 21 receives a strobe from the starting signal 101, it sets the number of the times for scanning the phase J from the control apparatus 3 to Reg 21, and thereafter, makes the signal line 103 for the AND circuit 24 to a high electric potential. The signal line 103 is reset when the signal line 111 is made to a high electric potential. The reset means for the signal line 103 is omitted.

When the phase scanning counter circuit 21 receives a strobe from the signal line 112 from the OR circuit 25, the circuit 21 transfers the content of Reg 21 to Reg 22, and makes the signal line 114 for the AND circuit 26 to a high potential. The signal line 114 is reset when the signal line 115 is made to the high electric potential. The resetting means for the signal 114 is omitted. When the phase scanning counter circuit 21 receives a strobe from the signal line 132, the circuit 21 decrements the content of Reg 22. As a result, when the content of Reg 22 becomes 0, the strobe is generated to the signal line 133 to the random address generator 16, and in the other case, the strobe is generated to the signal line 135 for the secondary electron signal processing circuit 13 and the retarding voltage control circuit 14. The relationships between the number J of times of scanning the phase, the number L of times for adding the secondary electron signal in the content of Reg 1, and the number M of times for adding all secondary electron signals in the content of Reg 2 is shown by following equation (5).

$$M = L \times J \quad (5)$$

Figure 36:
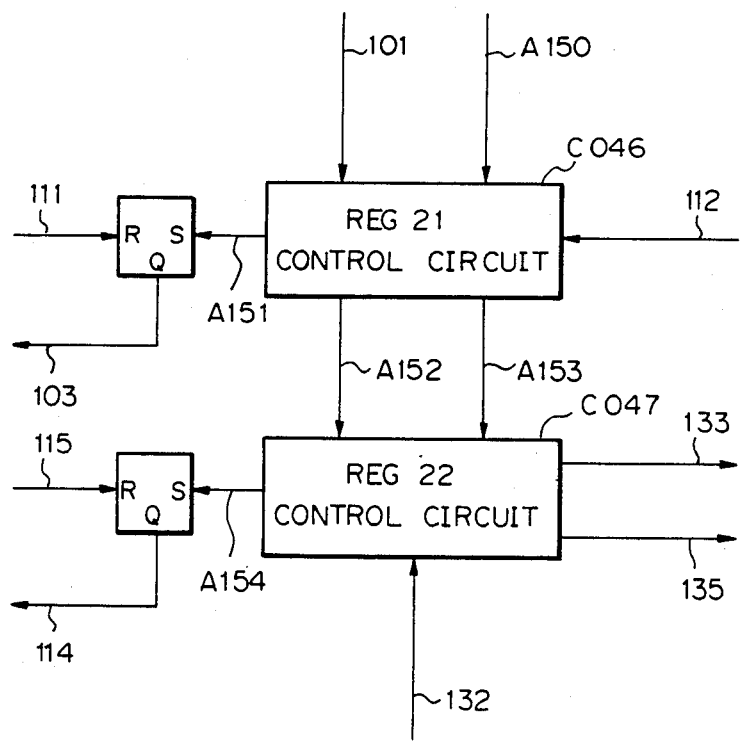
FIG. 36 is a block diagram of an internal construction of the phase scanning counter circuit 21 shown in FIG. 1.

{Explanation of an internal construction of the phase scanning counter circuit 21 (FIG. 36)}

The following is an explanation of the internal construction of the phase scanning counter circuit 21.

The phase scanning counter circuit 21 is formed by a Reg 21 control circuit C046 including a Reg 21 and a peripheral circuit thereof, a Reg 22 control circuit C047 including a Reg 22 and a peripheral circuit thereof, and flip-flop circuits.

When the Reg 21 control circuit C046 receives a strobe from the start signal 101, it reads the number of the phase scanning times J to Reg 21 via the signal line A150 from the control apparatus 3, and thereafter, generates a strobe to the signal line A151.

When the circuit C046 receives a strobe from the signal line 112, it writes the content of the Reg 21 in the signal line A152, and thereafter, generates a strobe to the signal line A153.

When the signal line 103 receives a strobe to the signal line A151, it is made to a high electric potential, and when it receives a strobe to the signal line 111, it is made to a low electric potential.

The signal line 111 and the signal line A150 are not shown in FIG. 1.

When the Reg 22 control circuit C047 receives a strobe to the signal line A153, it receives the content of the Reg 21, that is the number of scanning times J from the signal line A152, sets the same to the phase scanning counter Reg 22, and thereafter, generates a strobe to the signal line A154.

When the circuit C047 receives a strobe at the signal line 132, it decrements the phase scanning counter Reg 22, and if the content of the Reg 22 becomes 0, generates a strobe to the signal line 133, or in another case, generates a strobe to the signal line 135.

When the signal line 114 receives a strobe at the signal line A154, it is made to a high electric potential, and when it receives a strobe to the signal line 115, it is made to a low electric potential.

The signal line 115 is not shown in FIG. 1.

{Explanation of operation of the conversion flag setting circuit 22 (FIG. 1, FIG. 24)}

The following is an explanation of the conversion flag setting circuit 22. In the conversion flag setting circuit 22, as shown in FIG. 24, there is a 1 Bit register Reg 23 for storing a conversion flag. The conversion flag setting circuit 22 receives a strobe from the starting signal 101, and the circuit 22 clears Reg 23 and makes the signal line 108 for the AND circuit 24 to a high electric potential. The signal line 108 is reset when the signal line 111 is made to a high electric potential. The reset means for the signal line 108 is omitted. The content of Reg 23 appears in the conversion flag 139 for the AND circuit 33 and AND circuit 31. The conversion flag setting circuit 22 receives the strobe from the conversion flag setting request 144 from the conversion judgment circuit 18, and the circuit 22 sets the conversion flag to Reg 23, and when the value of the conversion flag 139 is determined, the circuit 22 generates a strobe to the signal line 146 for the repeating times setting circuit 19.

Figure 37:
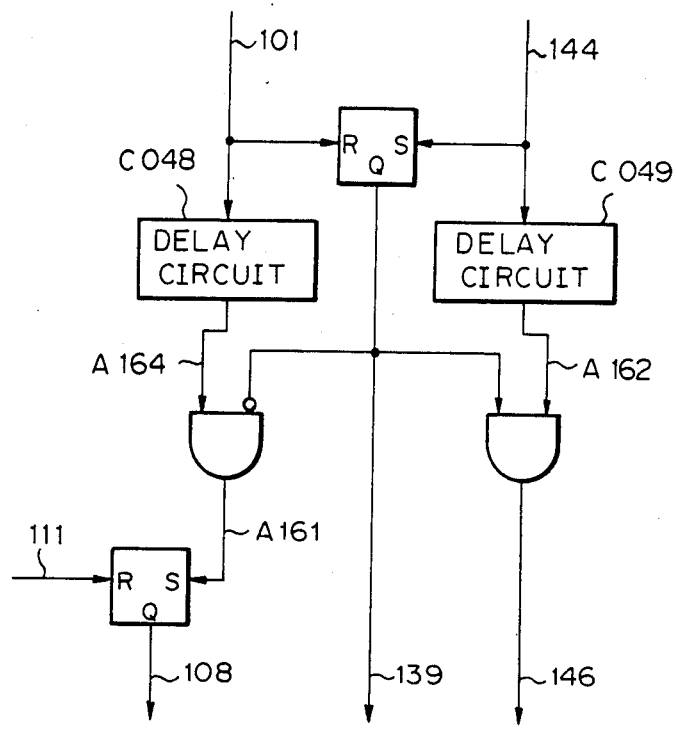
FIG. 37 is a block diagram of an internal construction of the conversion flag setting circuit 22 shown in FIG. 1; and, FIG. 38 is a block diagram of an internal construction of the retarding voltage adding counter circuit 23 shown in FIG. 1.
Figure 38:
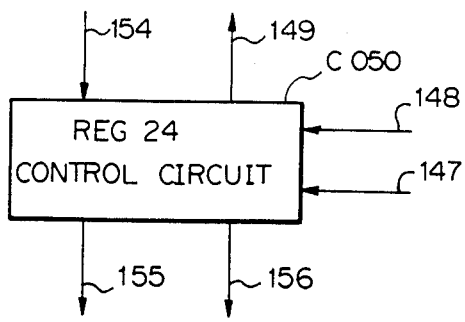

{Explanation of an internal construction of the conversion flag setting circuit 22 (FIG. 37)}

The following is an explanation of the internal construction of the conversion flag setting circuit 22.

The conversion flag setting circuit 22 is formed by delay circuits C048, C049, AND gates, and an RS flip-flip circuit. The conversion flag Reg 23 is formed by one flip-flop circuit.

The delay time of the delay circuits C048, C049 is suitable for determining a time slightly larger than that for stabilizing the value of the signal line 139, from when the signal line 101 or the signal line 144 receives the strobe.

When the signal line 108 receives a strobe from the signal line A161, it is made to a high electric potential, and when it receives a strobe from the signal line 111, it is made to a low electric potential.

The signal line 111 is not shown in FIG. 1.

{Explanation of operation of the retarding voltage adding counter circuit 23 (FIG. 1 and FIG. 25)}

The following is an explanation for the retarding voltage adding counter circuit 23. In the retarding voltage adding counter circuit 23, as shown in FIG. 25, there is a 10 Bit register Reg 24 for storing the number of times of adding of the retarding voltage. When the retarding voltage adding counter circuit 23 receives a strobe pulse from the signal line 148 from the repeating times setting circuit 19, the counter circuit 23 stores the repeated data 147 in Reg 24, and thereafter, the counter circuit 23 generates a strobe to the signal line 149 for the OR circuit 32. When the retarding voltage adding counter circuit 23 receives a strobe from the signal line 154 from the retarding voltage data processing circuit 17, the counter circuit 23 decrements the content of Reg 24, and when Reg 24 is 0, generates a strobe to the end signal 156, and when Reg is not 0, generates a strobe to the signal line 155 for the OR circuit 25.

Figure 5B:
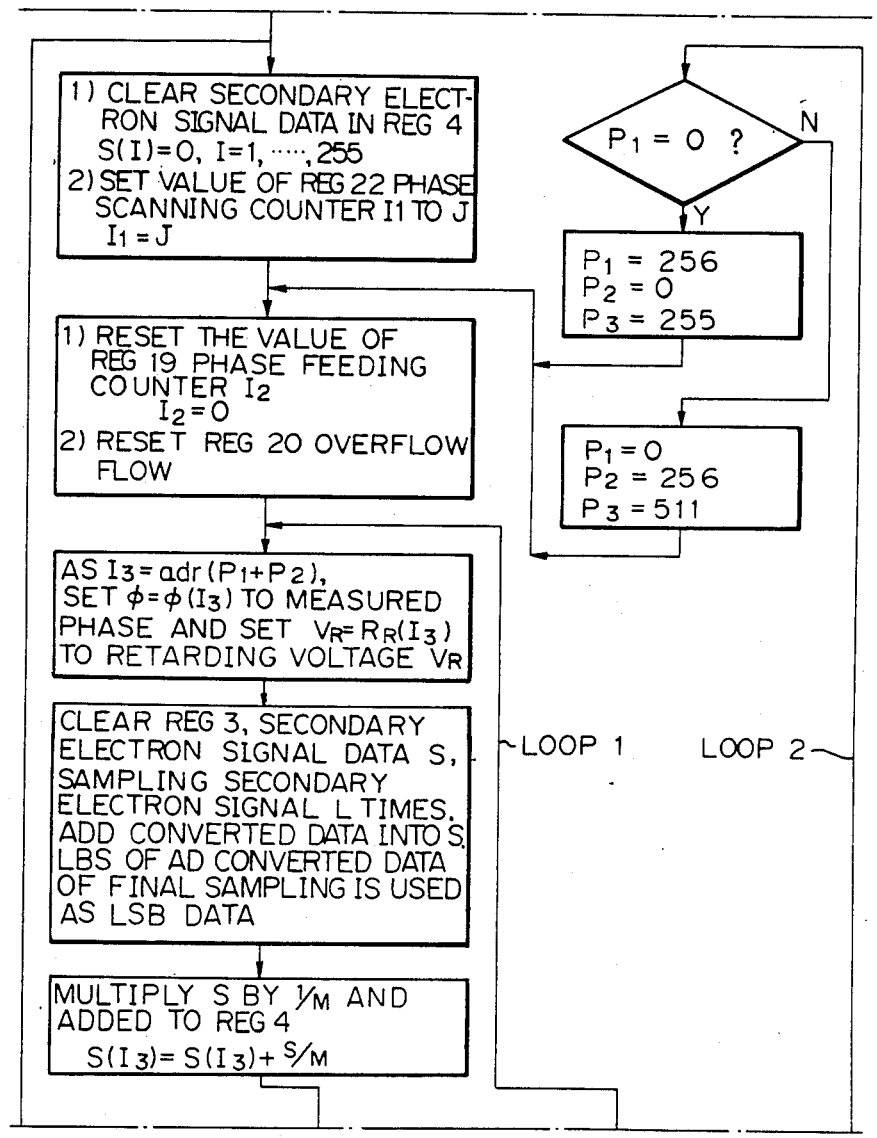
Figure 5C:
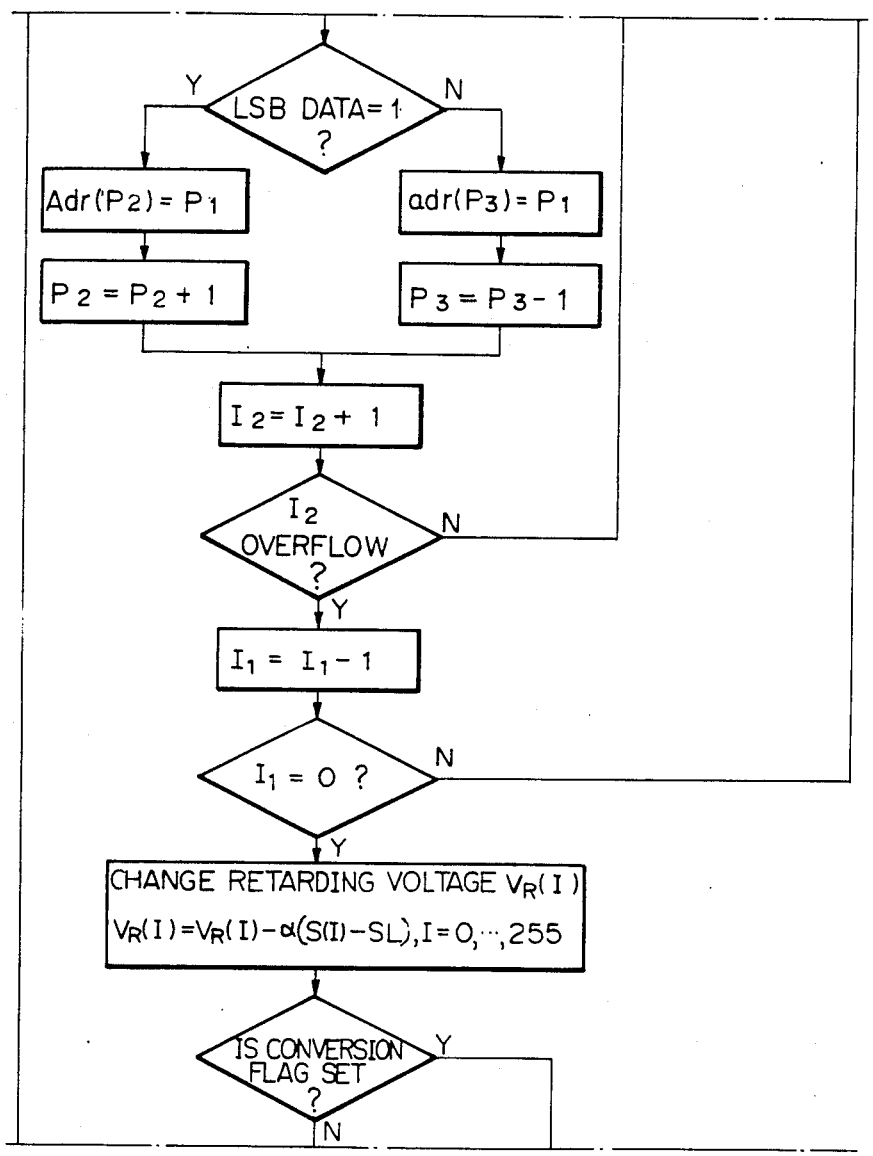
Figure 5D:
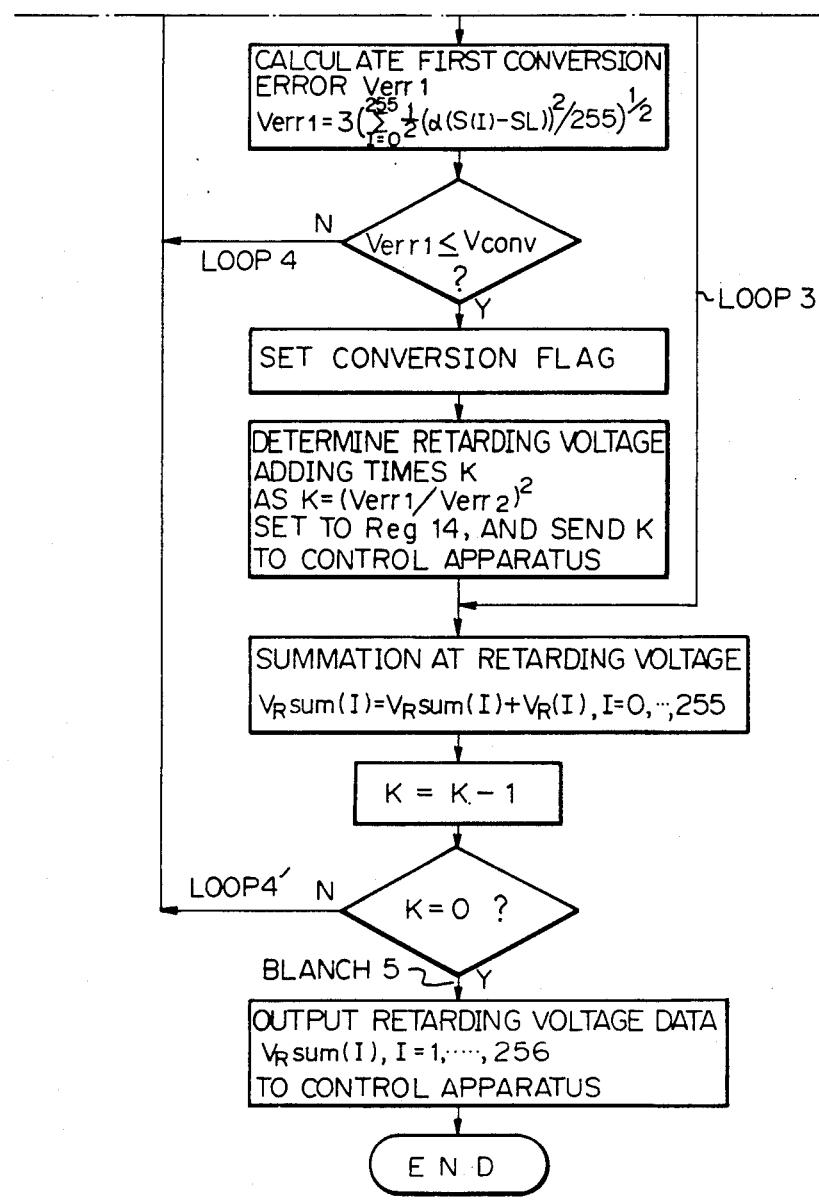

The operation of present invention mentioned above follows the operation sequence as shown in FIG. 5.

In FIG. 5, loops 1, 2, 3, 4, and 4', 5 correspond to the operations 1, 2, 3, 4, 5 already mentioned.

{Explanation of the principle of the invention (FIG. 6~FIG. 10)}

Hereinafter, the principle of the present invention will be explained.

Figure 6:
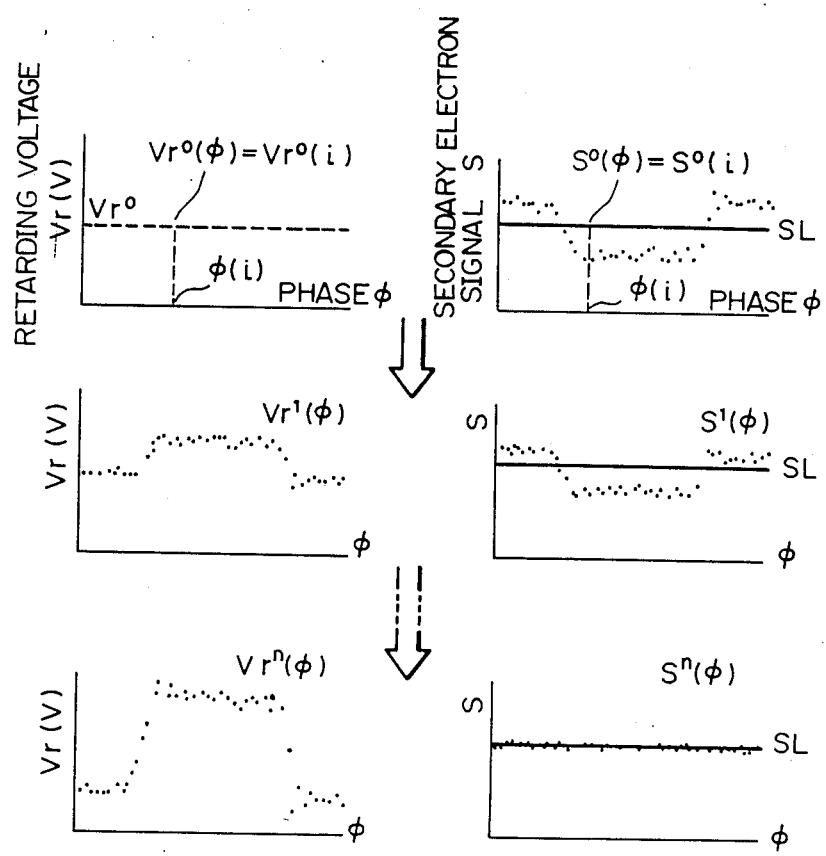
FIG. 6 is a diagram showing a principle of quantitizing the voltage waveform.

FIG. 6 shows the principle for quantifying the voltage waveform. In FIG. 6, $V_R$ is the retarding voltage in the voltage measurement energy analyzer and is the data of Reg 5 in the embodiment of the invention, S is an amount of the secondary electron signal which corresponds to the data of Reg 4 of the present invention. The suffix at the top right shows the renewed number of times the retarding voltage. N is the number of the measured phase points, and N=256 in the embodiment. A phase $\phi$ is a data of Reg 8 in the embodiment of the present invention. When the sampling of the secondary electron signal is carried out by the phase $\phi(i)$, and the measured voltage $V_{Rl}(i)$, $S_l(i)$ is obtained. When $S_l$ is obtained at all phases measured by the phase scanning, the retarding voltage $V_{Rl}$ is renewed by the equation (1) already mentioned.

By repeating the above-mentioned renewal operation, the retarding voltage goes from the initial value $V_{R0}$ (0 volts in the embodiment) to a converged value and the amount of the secondary electron signal coincides with the slice level SL except for the noise component.

Figure 7:
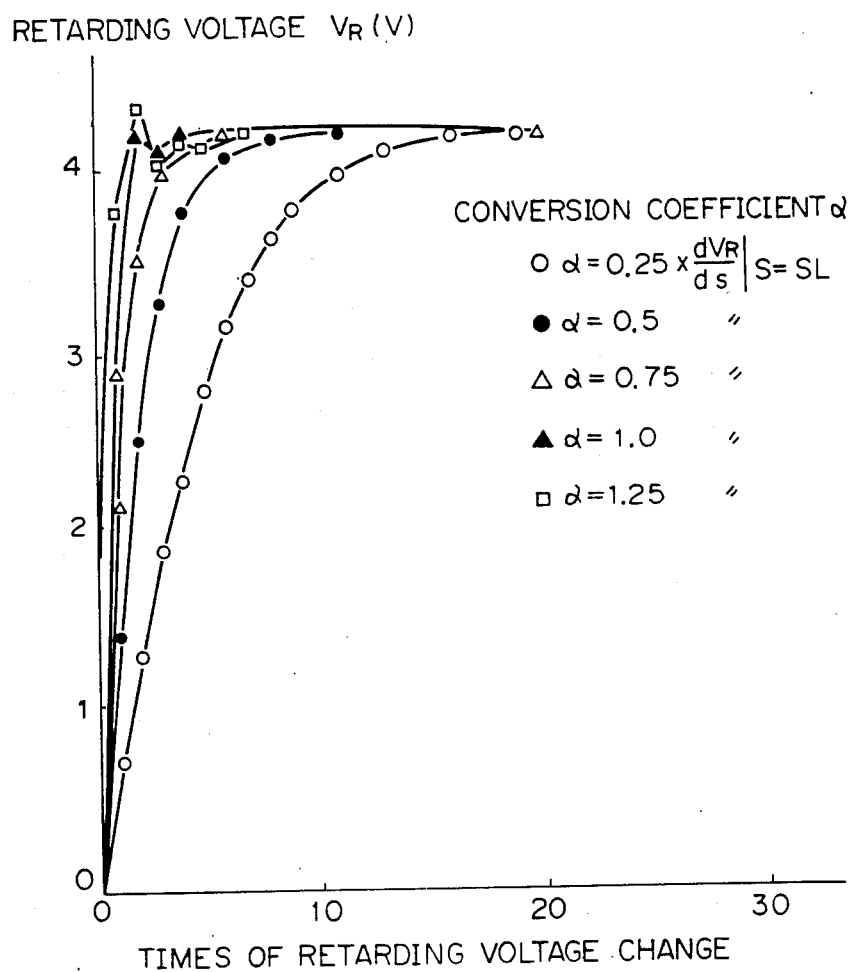
FIG. 7 is a diagram showing relationships between the number of times of changing the retarding voltage and the retarding voltage.

Next an explanation is given of the reason why the conversion coefficient $\alpha$ is given by the reciprocal of the inclination of the analyze curve at the crosspoint of the slice level and the analyze curve, and the reason why a primary convergence in which the convergence of the retarding voltage is carried out by renewing the retarding voltage in accordance with the already mentioned equation (1) and the reason why the adding of the mean times K of the retarding voltage which carries out the adding of the retarding voltage data renewed after the primary convergence and which obtains the analyzed voltage having an accuracy of the secondary convergence error $V_{err2}$ is given by the equation (3), (4). FIG. 7 shows a relationship between the times of renewal of the retarding voltage and the retarding voltage for five conversion coefficients $\alpha$. In FIG. 7, the initial value of the retarding voltage is set to 0 volts, and the retarding voltage is renewed in accordance with the already mentioned equation (1). In FIG. 7, it can be understood that, when the conversion coefficient $\alpha$ is selected to be the reciprocal of the inclination of the analyze curve at a the crosspoint of the slice level and the analyze curve, i.e., $$\alpha = \left.\frac{dV_R}{dS}\right|_{S=SL} \quad (6)$$

it most rapidly converges on the final convergence value 4.18 V.

Figure 8:
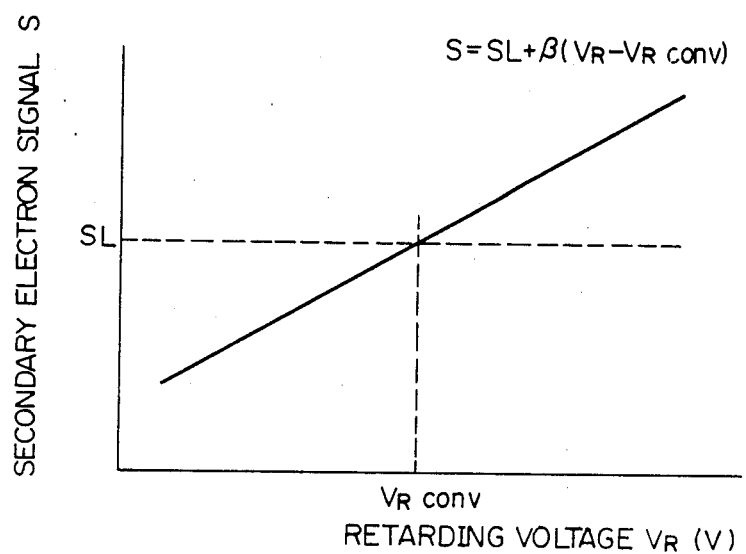
FIG. 8 is a diagram showing relationships between a retarding voltage $V_R$ near a slice level SL and amounts of a secondary electron signal.

The second reason for which the convergence coefficient $\alpha$ is set to the value shown by the equation (6) will be given hereinafter. As shown in FIG. 8, the relationships between the retarding voltage $V_R$ near the slice level SL and the amount of the secondary electron signal S is shown by the equation (7). In equations (7)~(9), the suffix l showing the number of times of the correction of the retarding voltage is placed in right under portion, to distinguish it from the number of times of multiplying. $n_l$ designating a white noise.

$$S_l = SL + \beta (V_{Rl} - V_{Rconv}) + n_l \quad (7)$$

$$\beta = \left.\frac{dS}{dV_R}\right|_{S=SL}$$

To ensure that the generality is not lost if it is set as SL=0, $V_{rconv}$=0, the following equation (7)' is used.

$$S_l = \beta V_{Rl} + n_l \quad (7)'$$

When the retarding voltage is corrected in accordance with the equation (1), $V_R$ is given by the equation (8).

$$V_{Rl} = (1 - \alpha\beta) V_{R0} - \alpha \sum_{I=0}^{l-1} n (1 - \alpha\beta)^{l-1-I} \quad (8)$$

In the equation (10), when it is set as $$\alpha = \left.\frac{dV_R}{dS}\right|_{S=SL} = \frac{1}{\beta}$$

$V_{Rl}$ is shown by the multiplication of $\alpha$ and the white noise $n_l$. As shown in the equation (9).

$$V_{Rl} = -\alpha n_{l-1} \quad (9)$$

There is a well known characteristic feature concerning the white noise wherein the dispersion is decreased in proportion to $K^{-\frac{1}{2}}$ by carrying out a K times adding. By using this characteristic feature, by carrying out a K times correction of the retarding voltage and the adding after the retarding voltage converges near to the slice level, the S/N of the measured value of the retarding voltage can be improved by $\sqrt{K}$ times.

Further, in the condition in which the relationships between the secondary electron signal amount S and the retarding voltage $V_R$ is linear so as to form the equation (7), the error $V_{err}1$ of the analyzed voltage can be determined from the equation (3). Therefore, to obtain a desired voltage measurement error $V_{err2}$, the analyzed voltage may be added and for the number of times determined by the equation (4).

Next, an explanation will be given of the effect of the random phase scanning method against the usual serial phase scanning method and the method for realizing the random phase scanning method.

Figure 9:
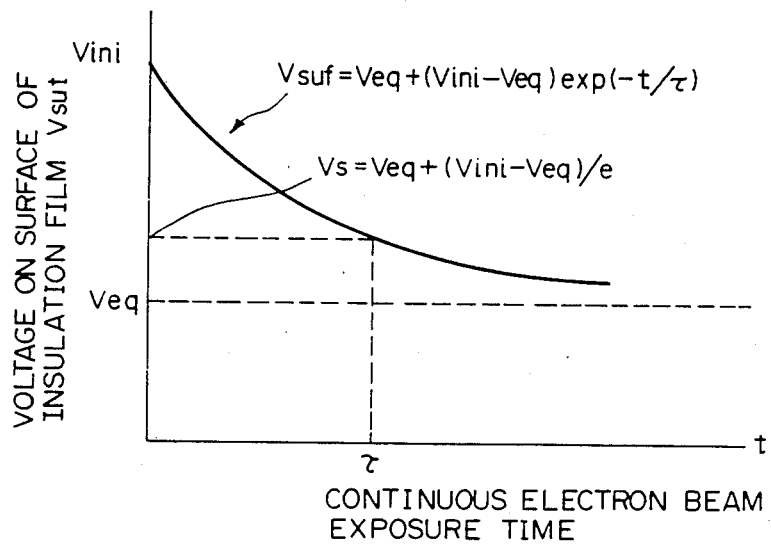
FIG. 9 is a diagram showing a relationship between a voltage on a surface of an insulation film and a time for injection of an electron beam.

When the electron beam is continuously exposed to the insulation film, in a simple model for explaining the charge up phenomena of an insulation film, regardless of the initial value $V_{ini}$ of the surface voltage of the insulation film $V_{suf}$, the insulation film surface voltage $V_{suf}$ becomes an equillibrium surface voltage $V_{eq}$ in a certain relaxation time $\tau$ as shown in FIG. 9. Here, $\tau$ is a relaxation time for a continuous electron beam. When it is assumed that the pulse width of the strobo electron beam is t $_\omega$.10$^{-9}$s and the repetition frequency is f×10$^6$ Hz, the relaxation time in the case of the strobo election beam can be shown as follows.

$$\tau_{stb} = \frac{\tau}{t_\omega \cdot f \cdot 10^{-3}} \text{ (sec)} \tag{10}$$

As a typical example when $\tau = 5$ μsec, the pulse width of the strobo electron beam is 1 ns, the repetition frequency is 1 MHz, $\tau_{stb}$ becomes 5 msec. When the voltage waveform having a repetition frequency of 1 MHz is measured at 256 phase points, when the number of the electron beam pulses at one phase point is L, the time $\tau_{scan}$ required for scanning one phase becomes as follows:

$$\tau_{scan} = 256.L.10^{-6} \text{ sec} \tag{11}$$

In the serial phase scanning usually used, if the condition of equation (12) is satisfied, an almost faithful measurement of the voltage wave is possible, wherein $$\tau_{scan} << \tau_{stb} \tag{12}$$

For example, if it is assumed that 10 $\tau_{scan} = \tau_{stb}$, it becomes about L=2. However, in this case, when the voltage waveform is quantitized in the embodiment of the present invention, the retarding voltage of the energy analyzer must be switched at 2 μsec, therefore, the portion which supplies the retarding voltage to the energy analyzer of the energy analyzing means and the phase scanning means requires a frequency response of about 10 MHz. Further, when the number of measuring points increases, the frequency response must be further increased, and thus the realization becomes difficult.

On the other hand, by using the technique of a so-called precharge method, the sampling in which 2$^{10}$ electron beams pulses are injected to one phase point at one precharge operation becomes possible. Further, the number of electron beam pulses does not depend on the number of measuring phase points. However, the electron beam pulse having an amount 10 times that needed when the sampling is carried out for the precharge is necessary, and therefore, the measuring time becomes long.

Conventionally, the precharge method is carried out by using the electron beam with a special phase, however, a similar effect can be obtained by exposing the electron beam and randomly changing the phase. Therefore, if the secondary electron signal is sampled by randomly scanning the phase, the sampling and the precharge are carried out at the same time, and the electron beam pulse of 2$^{10}$ per one phase point can be used regardless of the number of phase measuring points. Further, the response speed of the energy analyzer may be about 20 KHz, and this is easily realized.

Further, by carrying out the random phase scanning, the voltage waveform having a low frequency component can be measured in the same way as the voltage waveform having a high frequency component. This is very advantageous when the measurement is carried out via an insulation film.

Next, the method for realizing the random phase scanning will be explained. In the random phase scanning by the electron beam, all the measuring phases must be set accurately at one time by one phase scanning and the phase scanning is carried out with a different order at each phase scanning. Such a method for realizing the phase scanning is shown in FIG. 10. In the 0~255 addresses of the address data in Reg 9, the values combined randomly with the numbers 0~255 are stored. When the value I1 obtained by adding the content 0 of the base address pointer of Reg 10 and the content I1 of the phase feeding counter of Reg 19 is used as the address and the data is read from the address data of Reg 9, the value I2 is obtained The value read from the phase data of Reg 8 by using I2 as the address is set to the phase data 161, the value read from the retarding voltage data of Reg 5 using I2 as the address is DA converted and sets the retarding voltage 163, and the secondary electron signal is then sampled and the sampled value is written in the portion of the address I2 of the secondary electron signal data of Reg 4. If the LSB data 127 is 1, I2 is written in the Reg 9 by using a value P1 of Reg 11 as the address, to increment Reg 11 and increment Reg 19. If the LSB data 127 is 0, I2 is written in Reg 9 as the content of the address pointer of Reg 12 to decrement Reg 12 and increment Reg 19. When the Reg 19 overflows, if Reg 10 is 0, it is set as Reg 10=256, Reg 11=0, Reg 12=255, Reg 19=0, and if Reg 10=256, it is set as Reg 10=0, Reg 11=256, Reg 12=511, Reg 19=0, then the phase scanning can be effected by a new random sequence generated by a natural random LSB data 127.

{Result of experiments according to the present invention (FIG. 11 and FIG. 12)}

Figure 11A:
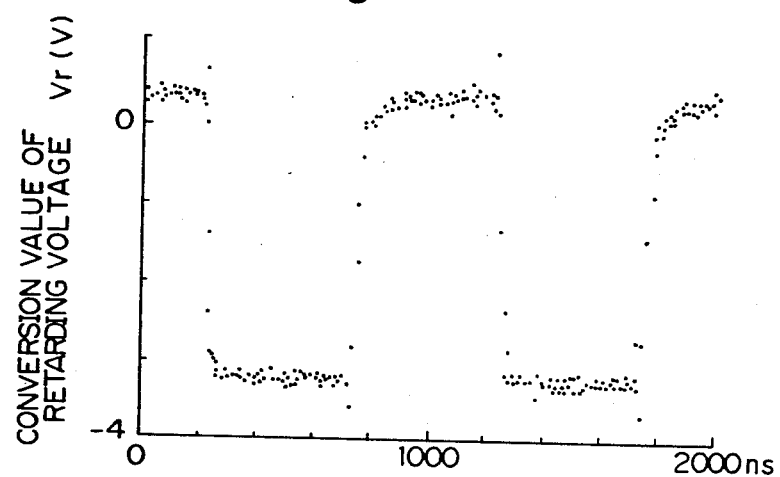
FIG. 11 is a diagram explaining an effect of the random scanning.
Figure 11B:
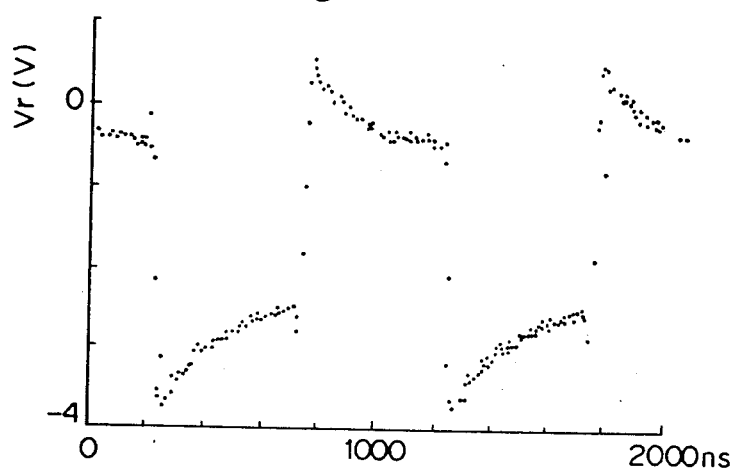
Figure 12:
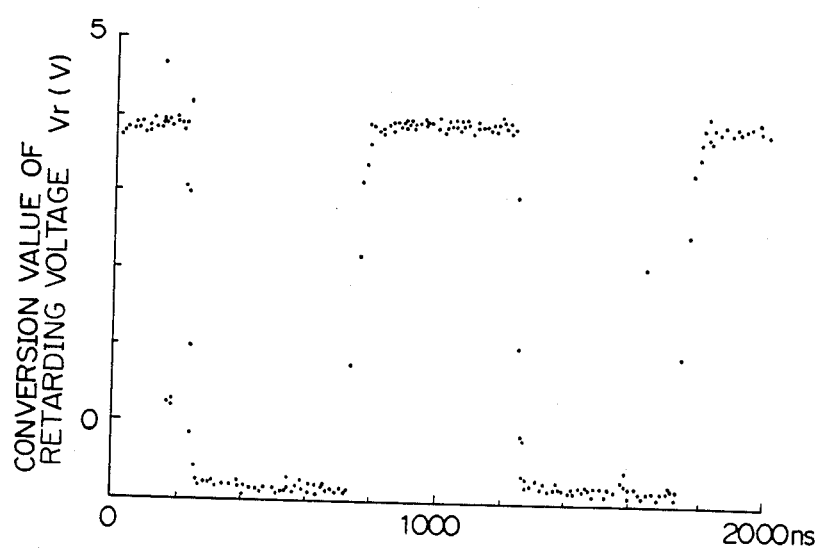
FIG. 12 is a diagram showing a measurement of a voltage waveform of an integrated circuit having no insulative film.

FIG. 11 shows the result of experiments with the present invention. The measurement is carried out by supplying a rectangular pulse wave having an amplitude of 5 V and a frequency of 1 MHz to a 5 μm electrode under the insulation protecting film (PSG) having a 1 μm thickness. The EB acceleration voltage is 1 kV, the EB pulse width 1 ns, and the number of pulses exposed per one phase point per one phase scanning is 2$^{10}$. The phase transferred width is 8 ns. FIG. 12 shows the case when the waveform in the IC excluding the PSG film is measured under a similar condition to that shown in FIG. 11. The wave distortion seen in the serial phase scanning (FIG. 11B) is removed by carrying out the random phase scanning (FIG. 11A). The attenuation of the amplitude when the voltage waveform is measured via the insulation film is due to the voltage drop by the electric field occurring inside the insulation film.

Thus, by using the present invention, the voltage waveform of the electrode under the insulation film can be quantitatively measured.

According to the present invention, the retarding voltage can be corrected and converged in a short time, and an analyzed measured voltage having a high S/N ratio can be obtained. Further, by randomly scanning the phase, if the electrode is placed under the insulation film a measurement having a high accuracy can be possible in a short time.

We claim:

1. A strobo electron beam apparatus comprising;

strobo electron beam means for producing a strobo electron beam and detecting a voltage in an examined integrated circuit having high speed operation;

phase scanning means for scanning a phase of the strobo electron beam;

energy analyzing means for analyzing an energy spectrum of secondary electrons generated at each phase scanning of the examined integrated circuit;

secondary electron signal detection means for detecting the secondary electron signal analyzed at each phase scanning;

retarding voltage control means for supplying a corrected retarding voltage to said energy analyzing means at each phase scanning in dependence upon the secondary electron signal obtained from said secondary electron signal detecting means;

conversion judgement means for calculating an error ($V_{err1}$) of the corrected retarding voltage so as to judge conversion of the secondary electron signal;

repeating means for repeating the operations of said phase scanning means, said secondary electron signal detection means, said retarding voltage cotrol means and said conversion judgement means when the error is judged to be beyond a predetermined value;

retarding voltage adding means for repeating the operations of said phase scanning means, said secondary electron signal detection means and said retarding voltage control means by a calculated number of times when the error is judged to be below the predetermined value by said conversion judgment means, the calculated number determined by the error and a desired voltage measurement accuracy ($V_{err2}$), and for calculating and outputting the addition of each phase scanning;

random phase scanning command means for issuing sets of phase scanning commands to control the scanning by said phase scanning means; and command order changing means for ordering the phase scanning commands in each set of the phase scanning commands issued by said random phase scanning command means.

2. A strobo electron beam apparatus according to claim 1, wherein said retarding voltage control means supplies the corrected retarding voltage for a number (N) of measuring phase points using a conversion coefficient ($\alpha$) that is greater than zero, a slice level (SL), an uncorrected retarding voltage ($V_R(I)$) and a measuring phase ($\phi(I)$), where I=1, ..., N, the corrected retarding voltage being defined by the following equation where the secondary electron signal is represented by S(I) and the corrected retarding voltage is represented by $V_R(I)'$:

$$V_R(I)' = V_R(I) - \alpha(S(I) - SL).$$

3. A strobo electron beam apparatus according to claim 2, wherein the error ($V_{err1}$) of the corrected retarding voltage is defined by:

$$V_{err1} = 3\sqrt{\frac{1}{2}\sum_{I=0}^{255}\frac{(\alpha(S(I) - SL))^2}{255}}.$$

4. A strobo electron beam apparatus according to claim 3, wherein the error ($V_{err1}$) of the corrected retarding voltage and the desired voltage measurement accuracy ($V_{err2}$) are used to determine a number of operations (K) to be repeated, where K is defined by:

$$K = (V_{err1}/V_{err2})^2.$$

5. A strobo electron beam apparatus according to claim 2, wherein said conversion coefficient $\alpha$ is an inverse value of a slope of an analyzed curve at a cross point of said slice level and said analyzed curve obtained as a relationship between said secondary electron S and said retarding voltage $V_R$ as shown by a following equation:

$$\alpha = \left.\frac{dV_r}{dS}\right|_{S=SL}$$

6. A strobo electron beam according to claim 1, wherein the error ($V_{err1}$) of the corrected retarding voltage and the desired voltage measurement accuracy ($V_{err2}$) are used to determine a number of operations (K) to be repeated, where K is defined by:

$$K = (V_{err1}/V_{err2})^2.$$

7. A strobo electron beam apparatus comprising:

strobo electron beam means for producing a strobo electron beam and detecting a voltage in an examined integrated circuit having high speed operation;

phase scanning means for scanning a phase of the strobo electron beam;

energy analyzing means for analyzing an energy spectrum of secondary electrons generated at each phase scanning of the examined integrated circuit;

secondary electron signal detecting means for detecting said secondary electron signal analyzed at each phase scanning;

retarding voltage control means for supplying a corrected retarding voltage to said energy analyzing means at each phase scanning in dependence upon the secondary electron signal obtained from said secondary electron signal detecting means;

random phase scanning command means for commanding random phase scanning by said phase scanning means; and command order changing means for changing the commanding of said phase scanning means by said random phase scanning command means.

* * * * *